(12) United States Patent
Futatsuyama et al.

(10) Patent No.: US 8,711,635 B2
(45) Date of Patent: *Apr. 29, 2014

(54) NONVOLATILE SEMICONDUCTOR MEMORY DEVICE

(75) Inventors: Takuya Futatsuyama, Yokohama (JP); Toshiaki Edahiro, Yokohama (JP); Norihiro Fujita, Yokohama (JP); Fumitaka Arai, Yokohama (JP); Tohru Maruyama, Kamakura (JP); Masaki Kondo, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/618,537

(22) Filed: Sep. 14, 2012

(65) Prior Publication Data

US 2013/0010541 A1    Jan. 10, 2013

Related U.S. Application Data

(62) Division of application No. 12/491,638, filed on Jun. 25, 2009, now Pat. No. 8,315,104.

(30) Foreign Application Priority Data

Jun. 30, 2008    (JP) ................................ 2008-171491

(51) Int. Cl.
*G11C 11/34*    (2006.01)

(52) U.S. Cl.
USPC ............ 365/185.22; 365/185.25; 365/185.01; 365/185.03; 365/185.05; 365/185.18; 365/185.19; 365/185.21; 365/203; 365/204; 365/207; 365/189.05

(58) Field of Classification Search
USPC ............ 365/185.22, 185.25, 185.01, 185.03, 365/185.05, 185.18, 185.19, 185.21, 365/189.15, 203, 204, 207, 189.05
See application file for complete search history.

(56) References Cited

U.S. PATENT DOCUMENTS

| 6,643,188 | B2 | 11/2003 | Tanaka et al. |
|---|---|---|---|
| 6,807,104 | B2 | 10/2004 | Arai et al. |
| 7,486,562 | B2 | 2/2009 | Ogawa et al. |
| 7,505,312 | B2 | 3/2009 | Matsunaga et al. |

(Continued)

FOREIGN PATENT DOCUMENTS

| JP | 10-228792 | 8/1998 |
|---|---|---|
| JP | 2003-196988 | 7/2003 |
| JP | 2006-331618 | 12/2006 |
| JP | 2007-141447 | 6/2007 |

OTHER PUBLICATIONS

Office Action issued Aug. 7, 2012 in Japanese Application No. 2008-171491 filed Jun. 30, 2008 (w/English translation).

*Primary Examiner* — Fernando Hidalgo
(74) *Attorney, Agent, or Firm* — Oblon, Spivak, McClelland, Maier & Neustadt, L.L.P.

(57) ABSTRACT

A nonvolatile semiconductor memory device includes a memory cell which stores data and which is capable of being rewritten electrically, a bit line which is connected electrically to one end of a current path of the memory cell, a control circuit which carries out a verify operation to check a write result after data is written to the memory cell, and a voltage setting circuit which sets a charging voltage for the bit line in a verify operation and a read operation and makes a charging voltage in a read operation higher than a charging voltage in a verify operation.

10 Claims, 17 Drawing Sheets

(56) References Cited

U.S. PATENT DOCUMENTS

| | | |
|---|---|---|
| 7,649,776 B2 | 1/2010 | Abiko et al. |
| 7,701,777 B2 | 4/2010 | Ogawa et al. |
| 7,764,542 B2 | 7/2010 | Edahiro et al. |
| 7,768,844 B2 | 8/2010 | Takase et al. |
| 7,859,898 B2 | 12/2010 | Sato et al. |
| 7,907,446 B2 | 3/2011 | Shimizu et al. |
| 2005/0185468 A1* | 8/2005 | Hosono et al. ............ 365/185.22 |
| 2006/0098488 A1 | 5/2006 | Tanaka et al. |
| 2006/0245261 A1 | 11/2006 | Morooka |
| 2007/0159881 A1 | 7/2007 | Sato et al. |
| 2007/0171744 A1* | 7/2007 | Mokhlesi et al. .............. 365/203 |

* cited by examiner

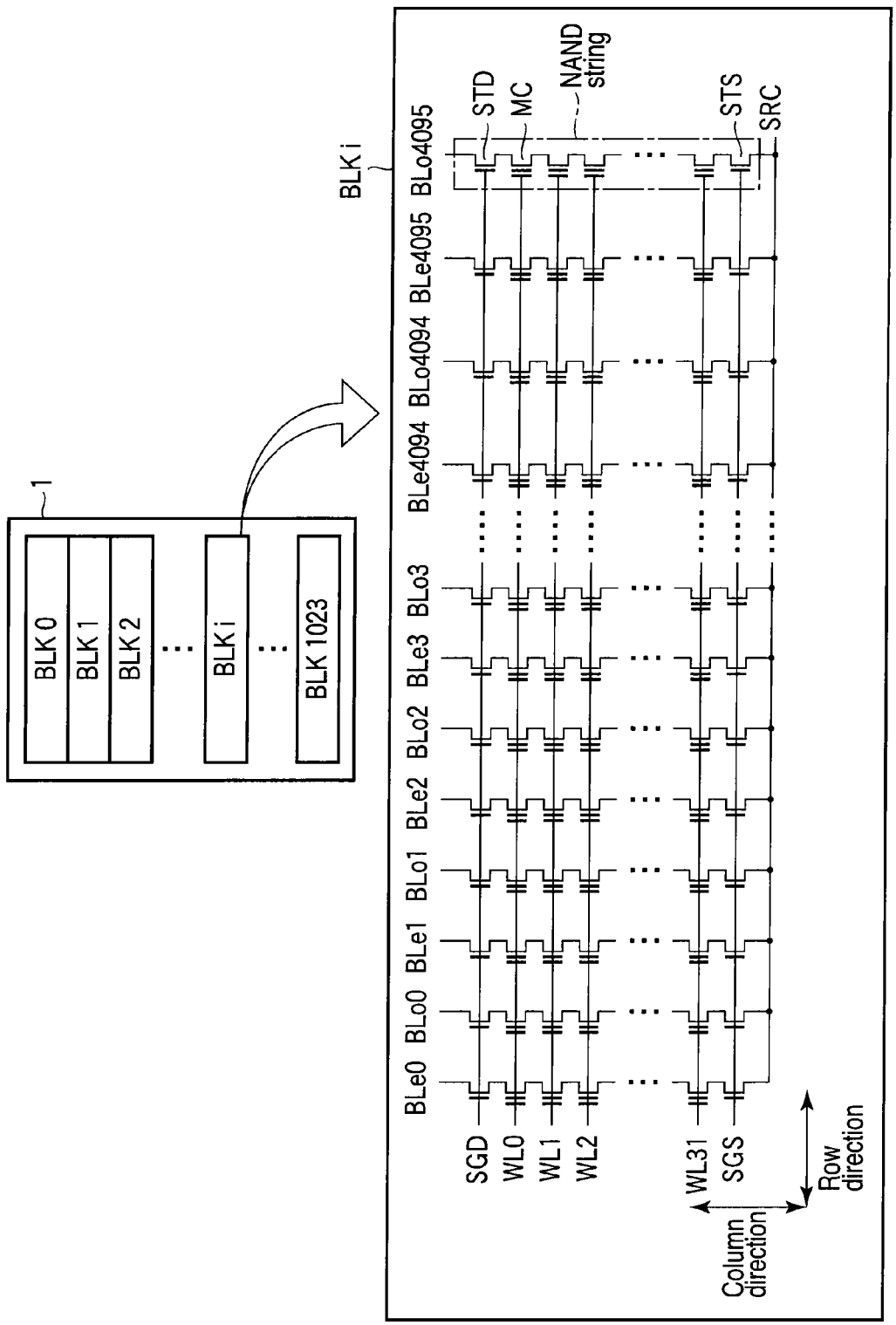
F I G. 4

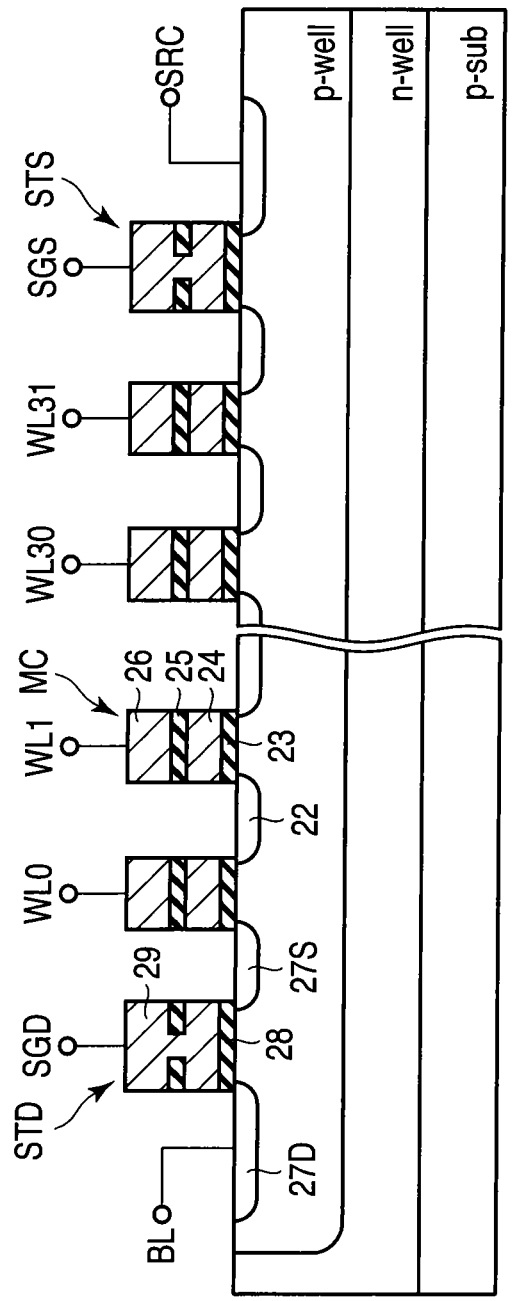
F I G. 5

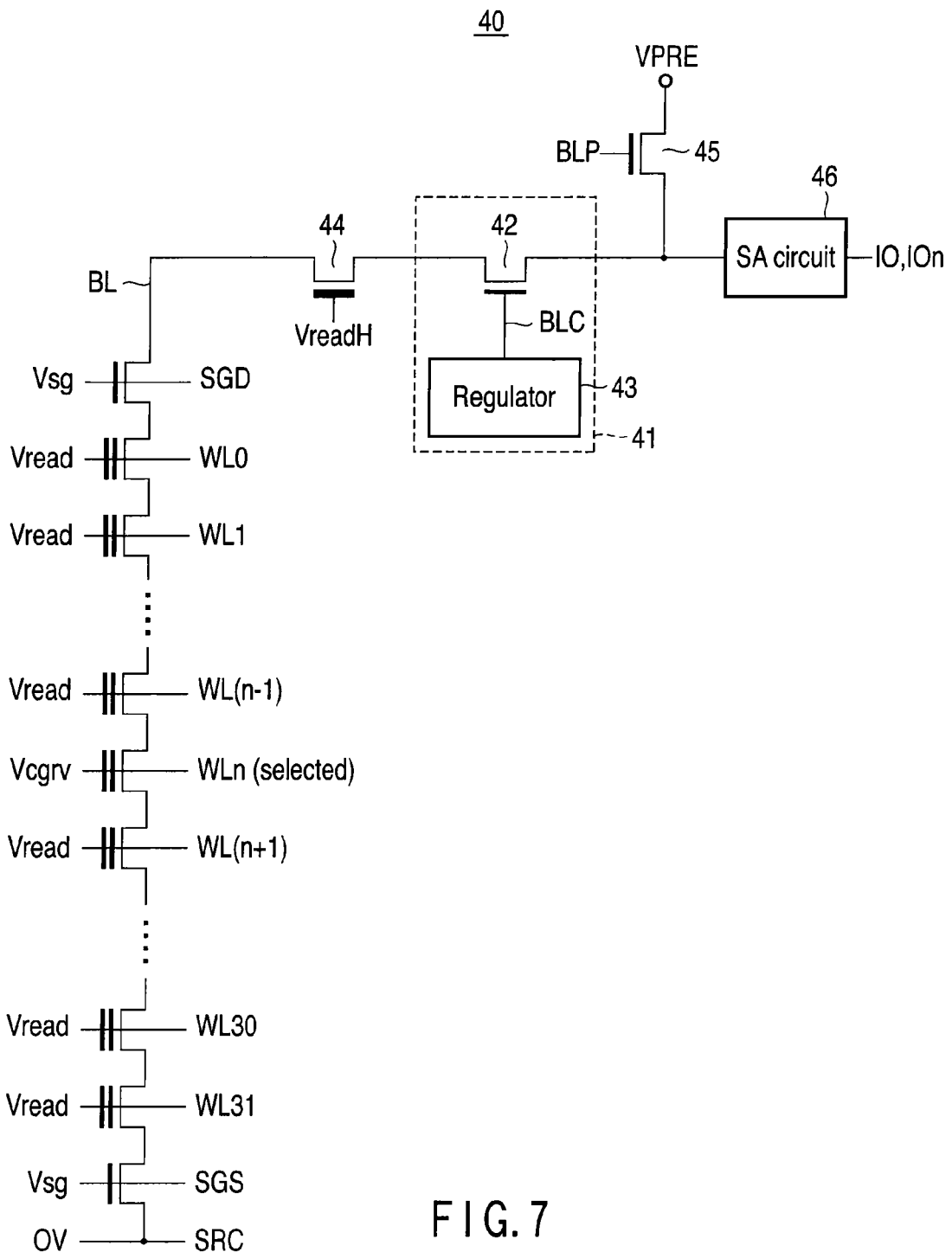
F I G. 7

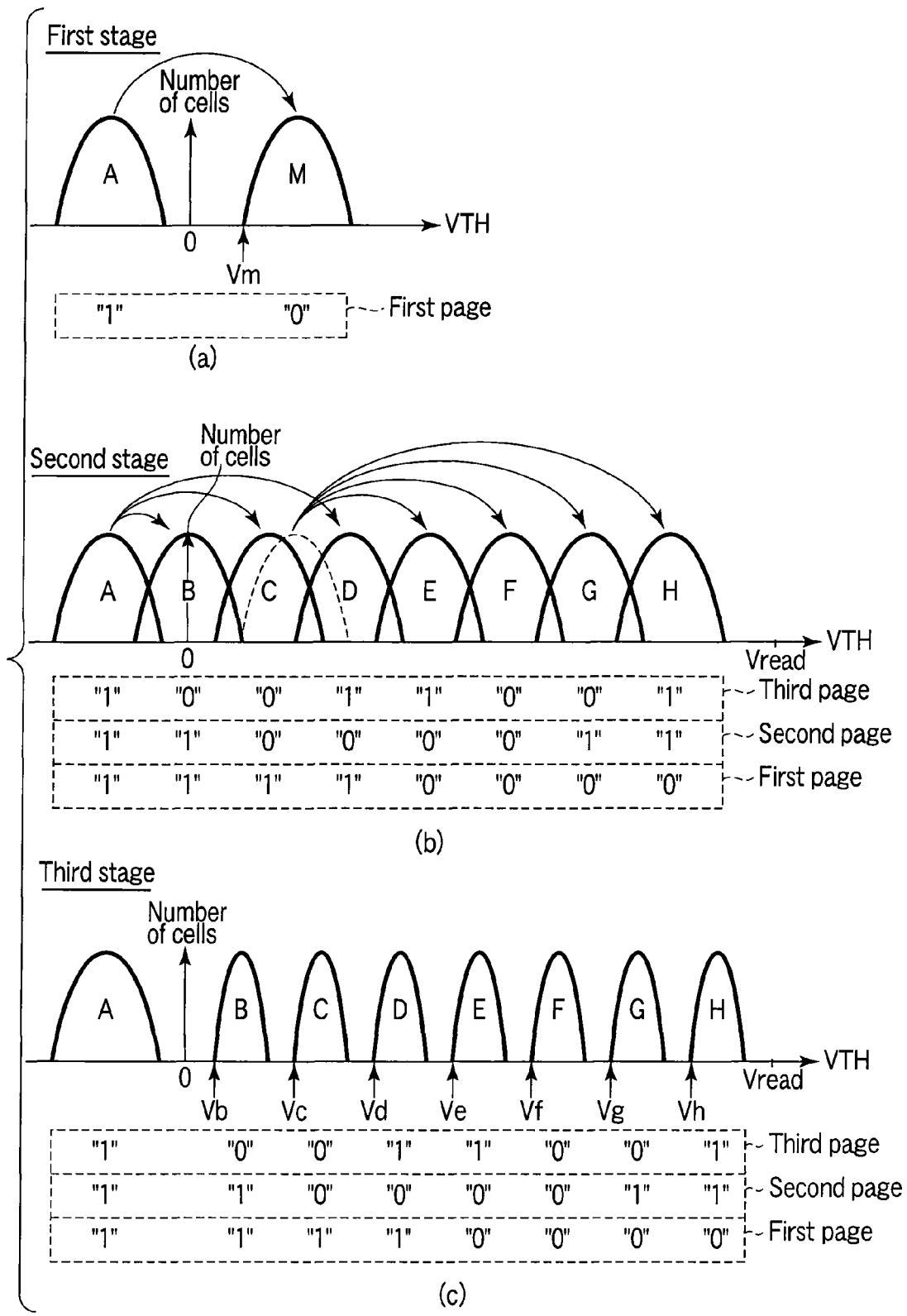
F I G. 20

NONVOLATILE SEMICONDUCTOR MEMORY DEVICE

CROSS-REFERENCE TO RELATED APPLICATIONS

This application is a division of and claims the benefit of priority under 35 U.S.C. §120 from U.S. Ser. No. 12/491,638 filed Jun. 25, 2009 (now U.S. Pat. No. 8,315,104 issued Nov. 20, 2012), and claims the benefit of priority under 35 U.S.C. §119 from Japanese Patent Application No. 2008-171491 filed Jun. 30, 2008, the entire contents of each of which are incorporated herein by reference.

BACKGROUND OF THE INVENTION

1. Field of the Invention

This invention relates to a nonvolatile semiconductor memory device, and more particularly to a nonvolatile semiconductor memory device with electrically rewritable memory cells.

2. Description of the Related Art

With the recent rapid spread of digital cameras, portable audio players, and the like, the demand for high-capacity nonvolatile semiconductor memories has been expanding. NAND flash memories have been widely used as nonvolatile semiconductor memories. To realize a high-capacity NAND flash memory, a multilevel NAND flash memory which stores a plurality of items of data in a single memory cell has been proposed.

In a NAND flash memory, data is determined by the threshold voltage of a memory cell. Accordingly, to record multilevel data, one of a plurality of threshold voltages is set in a memory cell. As elements have been miniaturized further, the distance between memory cells has been decreasing. Consequently, the effect of intercell interference caused by capacitive coupling between adjacent cells has been becoming greater.

In addition, as a related technique, the technique for narrowing the width of the threshold voltage distribution of memory cells by changing the transfer voltage to a bit line in a write operation has been disclosed (Jpn. Pat. Appln. KOKAI Publication No. 2006-331618).

BRIEF SUMMARY OF THE INVENTION

According to an aspect of the present invention, there is provided a nonvolatile semiconductor memory device comprising: a memory cell which stores data and which is capable of being rewritten electrically; a bit line which is connected electrically to one end of a current path of the memory cell; a control circuit which carries out a verify operation to check a write result after data is written to the memory cell; and a voltage setting circuit which sets a charging voltage for the bit line in a verify operation and a read operation and makes a charging voltage in a read operation higher than a charging voltage in a verify operation.

According to an aspect of the present invention, there is provided a nonvolatile semiconductor memory device comprising: a memory cell which stores data and which is capable of being rewritten electrically; a bit line which is connected electrically to one end of a current path of the memory cell; a control circuit which carries out a verify operation to check a write result after data is written to the memory cell and which, when setting the memory cell to a first threshold voltage, carries out a first verify operation using a second threshold voltage lower than the first threshold voltage and a second verify operation using the first threshold voltage; and a voltage setting circuit which sets a charging voltage for the bit line in a verify operation and makes a charging voltage in the second verify operation higher than a charging voltage in the first verify operation.

According to an aspect of the present invention, there is provided a nonvolatile semiconductor memory device comprising: a memory cell which stores data and which is capable of being rewritten electrically; a bit line which is connected electrically to one end of a current path of the memory cell; a control circuit which carries out a verify operation to check a write result after data is written to the memory cell and which, when setting the memory cell to a specific threshold voltage, carries out a write loop including a verify operation a plurality of times; and a voltage setting circuit which sets a charging voltage for the bit line in a verify operation and makes the charging voltage higher as the number of write loops increases.

BRIEF DESCRIPTION OF THE SEVERAL VIEWS OF THE DRAWING

FIG. 4 shows an example of the memory cell array 1 shown in FIG. 3;

FIG. 5 is a sectional view showing the configuration of a NAND string;

FIG. 7 shows the configuration of a data circuit 40;

FIG. 20 shows another example of the threshold voltage distribution of a memory cell MC which stores 3-bit data.

DETAILED DESCRIPTION OF THE INVENTION

Figure 1:
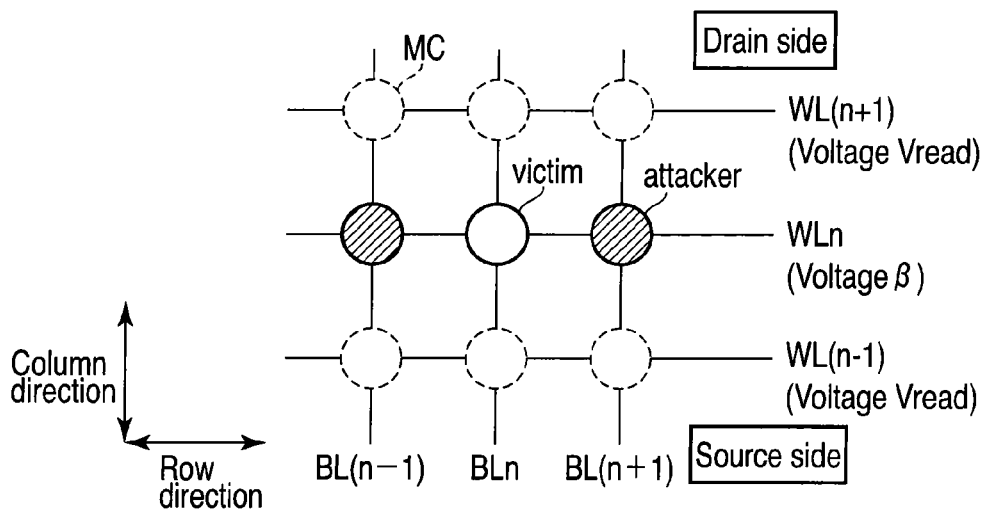
FIG. 1 is a schematic diagram of a part of a memory cell array.

The embodiments of the present invention will be described hereinafter with reference to the accompanying drawings. In the description which follows, the same or functionally equivalent elements are denoted by the same reference numerals, to thereby simplify the description.

[Consideration for the Invention]

FIG. 1 is a schematic diagram of a part of a memory cell array. The memory cell array includes a plurality of flash memory cells MC. In the memory cell array, a plurality of word lines WL (including WL(n−1), WLn, WL(n+1)) are arranged so as to extend in the row direction. Further in the memory cell array, a plurality of bit lines BL (including BL(n−1), BLn, BL(n+1)) are arranged so as to extend in the column direction. At the intersections of the word lines WL and the bit line BL, the memory cells MC are arranged in a one-to-one correspondence. The control gate electrode of each of the memory cells MC is connected to the corresponding one of the word lines WL. Three memory cells MC arranged in the column direction are connected in series, with the drain-side end of them being connected via a select transistor STD (not shown) to a bit line BL and the source-side end of them being connected via a select transistor STS (not shown) to a source line SRC (not shown).

For example, attention is focused on three memory cells MC connected to the selected word line WLn. Of these, the memory cell connected to bit line BL(n+1) is referred to as an attacker and the memory cell connected to the bit line BLn is referred to as a victim. Explanation will be given on the assumption that a cell (victim) has been written to earlier and a cell (attacker) hasn't been written to yet. In FIG. 1, a cell which has been written to is represented by a solid outline circle and a cell which hasn't been written to yet is represented by a hatched circle.

Figure 2:
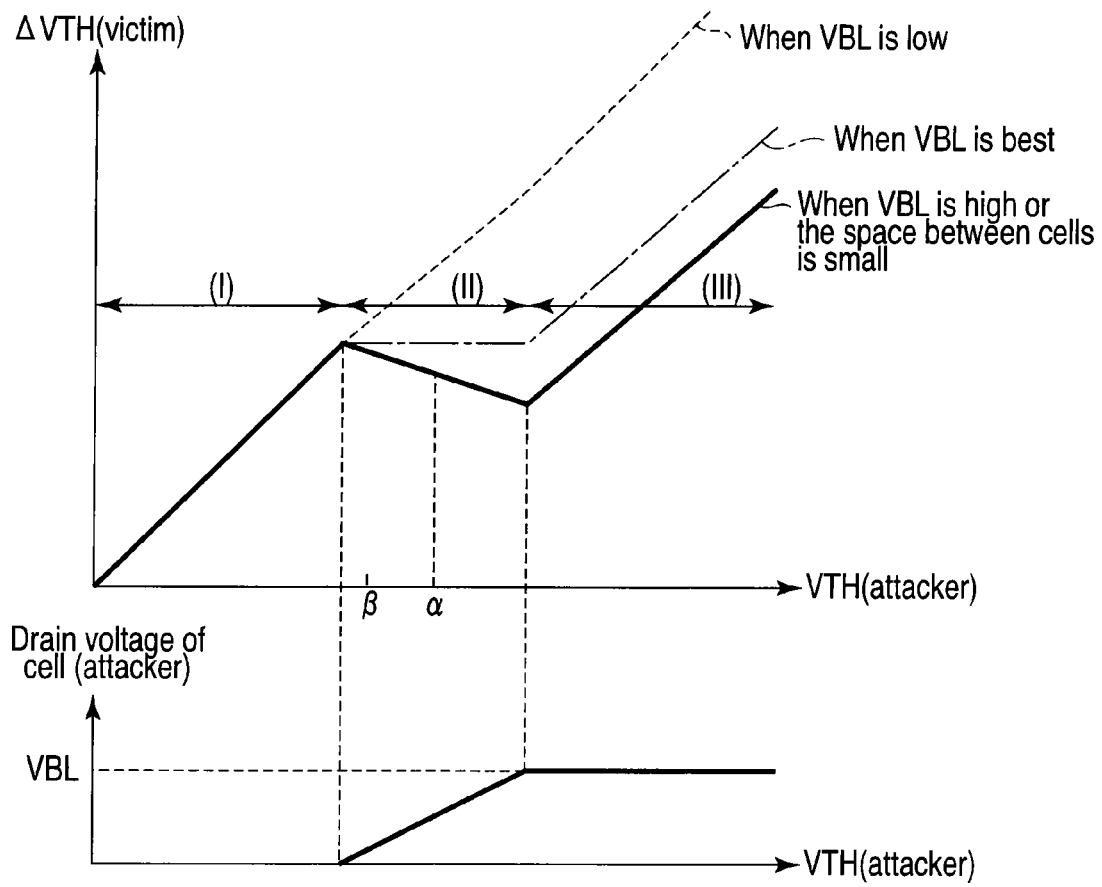
FIG. 2 shows the relationship between the threshold voltage Vth (attacker) of a cell (attacker) and a threshold voltage variation ΔVth (victim) of a cell (victim)

FIG. 2 shows the result of determining in the form of a variation ΔVTH (victim) how the threshold voltage of a cell (victim) fluctuates when the cell (victim) is written to up to a threshold voltage α and then the threshold voltage VTH (attacker) of a cell (attacker) is changed. FIG. 2 also shows the relationship between the threshold voltage VTH (attacker) of the cell (attacker) and the drain voltage. "VBL" shown in FIG. 2 is a charging voltage for a bit line in a read operation. A read voltage β(≤α) for reading data from the cell (victim) is applied to the selected word line WLn. A read voltage Vread that turns on all the memory cells MC is applied to word line WL(n−1) and word line WL(n+1), thereby turning on the memory cells MC connected to these word lines. In FIG. 2, region (I) shows a case where the threshold voltage VTH of the cell (attacker) is lower than the threshold voltage a of the cell (victim), region (II) shows a case where threshold voltage VTH (attacker) is almost the same as the threshold voltage α, and region (III) shows a case where the threshold voltage VTH (attacker) is higher than the threshold voltage α.

In region (I), the cell (attacker) is on and the cell (victim) is off. Since the cell (victim) has been written to, the threshold voltage of the cell (victim) rises due to intercell interference by the value by which the threshold voltage of the cell (attacker) fluctuated from the erased state. As the threshold voltage of the cell (attacker) gets higher, the threshold voltage of the cell (victim) also gets higher due to the capacitive coupling between the charge storage layers (e.g., floating gate electrodes) of the cell (attacker) and cell (victim). At this time, both the drain voltage and source voltage of the cell (attacker) are at about 0 V, the drain voltage of the cell (victim) is at about VBL, and the source voltage of the cell (victim) is at about 0 V.

In region (II), the cell (attacker) is on the border between on and off. The drain voltage of the cell (attacker) is at a voltage equal to or lower than VBL and its source voltage is at about 0 V. The cell (victim) is off. At this time, the drain voltage of the cell (attacker) is higher than 0 V, which is different from that in region (I). The capacitive coupling between the drain voltage (the voltage in the diffused region) of the cell (attacker) and the floating gate electrode of the cell (victim) raises the voltage of the floating gate electrode of the cell (victim). As a result, in region (II), the threshold voltage (victim) appears lower as the threshold voltage of the cell (attacker) gets higher. This has the effect of, as the memory cells are miniaturized further, lowering the threshold voltage of the cell (victim) more than a rise in the threshold voltage of the cell (victim) caused by the capacitive coupling between the floating gate electrodes of the cell (attacker) and cell (victim) as explained in region (I). This makes the characteristic of FIG. 2 different from a monotonically increasing characteristic (a solid line in region (II) of FIG. 2). Conversely, if the charging voltage VBL for the bit line in a read operation is made lower, the effect can be decreased (a broken line in region (II) of FIG. 2). If the charging voltage VBL for the bit line is set optimally, a decrease in the threshold voltage of the cell (victim) can be alleviated in region (II) (a dashed-dotted line in region (II) of FIG. 2).

In region (III), both the cell (attacker) and the cell (victim) are off. Since the cell (victim) has been written to, the threshold voltage of the cell (victim) rises due to intercell interference by the value by which the threshold voltage of the cell (attacker) changed from the erased state. As the threshold voltage of the cell (attacker) gets higher, the threshold voltage of the cell (victim) also gets higher due to the capacitive coupling between the floating gate electrodes of the cell (attacker) and the cell (victim). At this time, both the drain voltages of the cell (attacker) and the cell (victim) are at about VBL and their source voltages are both at about 0 V.

As described above, in region (II) of FIG. 2, as the memory cells are miniaturized further, the effect of intercell interference caused by the charging voltage for the bit line increases, which lowers the threshold voltage of the cell (victim). As a result, the cell (victim) which has been written to is determined not to have been written to, making it more liable to malfunction. Moreover, the margin for the data retention characteristic (the characteristic of holding charges in the charge storage layer without leaking them even if time passes) decreases, making the data retention characteristic more liable to deteriorate. If an increased breadth of the threshold voltage distribution is secured to maintain the data retention characteristic, when a write operation and an erase operation are repeated, the amount of passing charge between the substrate and the charge storage layer increases. As a result, the reliability of the gate insulating film of a cell decreases, which makes it difficult to guarantee a desired number of times the cell can be rewritten.

Hereinafter, embodiments of the invention using the above-described effects will be explained in detail.

First Embodiment

Figure 3:
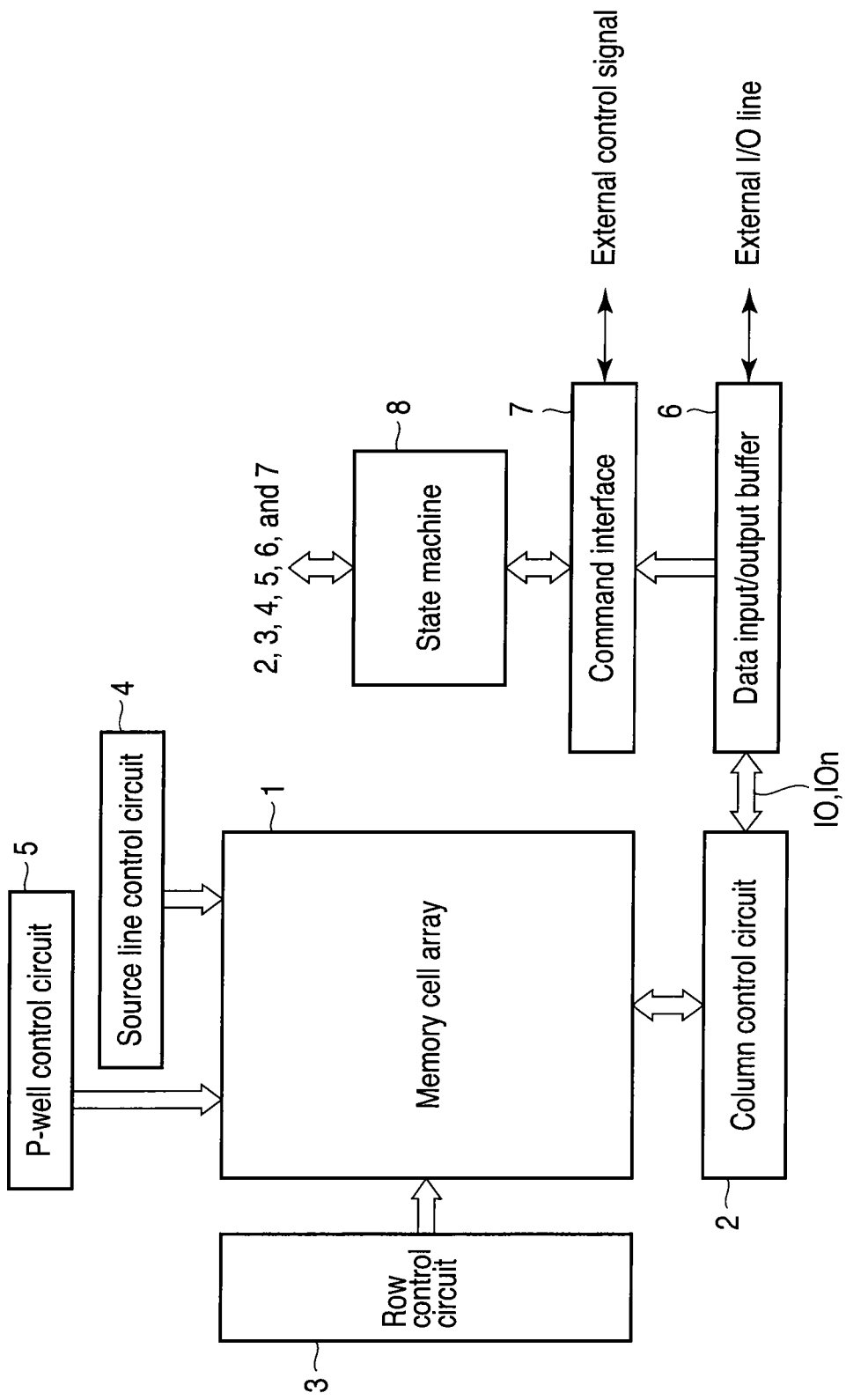
FIG. 3 is a block diagram of a nonvolatile semiconductor memory device according to a first embodiment of the invention.

FIG. 3 is a block diagram of a nonvolatile semiconductor memory device according to a first embodiment of the invention. A memory cell array 1 is so configured that a plurality of nonvolatile semiconductor memory cells are arranged in a matrix. Flash memory cells are one example of such nonvolatile semiconductor memory cells. While in the first embodiment, a NAND flash memory is shown as one example of the nonvolatile semiconductor memory, the invention is not limited to this and may be applied to memory other than the NAND flash memory. A column control circuit 2 and a row control circuit 3 are connected to the memory cell array 1.

The column control circuit 2, which controls the bit lines provided in the memory cell array 1, erases data in a memory cell, writes data to a memory cell (including a verify operation), and reads data from a memory cell. The row control circuit 3 selects a word line in the memory cell array 1 and then applies a voltage necessary for an erase, write, verify, or read operation to the word line.

A source line control circuit 4, which controls the source lines in the memory cell array 1, applies specific voltages to the source lines according to various operations. A p-well control circuit 5 controls the voltage of a p-type semiconductor region (p-well) in which the memory cell array 1 is formed, according to various operations.

A data input/output buffer 6 is electrically connected not only to the column control circuit 2 via a plurality of input/output line pairs IO, IOn but also to an external host device (not shown) via an external I/O line. In the data input/output buffer 6, for example, an input/output buffer circuit is provided. The data input/output buffer 6 receives write data from the outside, outputs read data to the outside, and receives address data and commands from the outside. The data input/output buffer 6 sends the received write data to the column control circuit 2 via the input/output line pairs IO, IOn or receives the read data from the column control circuit 2 via the input/output pairs IO, IOn. The data input/output buffer 6 sends the address data input from the outside to select an address in the memory cell array 1, directly or via a state machine 8 to the column control circuit 2 or row control circuit 3. The data input/output buffer 6 sends a command from the host device to a command interface 7.

The command interface 7 receives a control signal from the host device via an external control signal line and determines whether the data input to the data input/output buffer 6 is write data, a command, or address data and, if it is a command, then sends it as command data to the state machine 8.

The state machine (control circuit) 8 manages the entire nonvolatile semiconductor memory device (flash memory). Specifically, supplying a control signal to each of the circuits, the state machine 8 receives a command from the host device and performs an erase, write, verify, read or data input/output operation.

FIG. 4 shows an example of the memory cell array 1 shown in FIG. 3. As shown in FIG. 4, the memory cell array 1 includes a plurality of blocks, for example, 1024 blocks BLK0 to BLK1023. One block BLK is the minimum unit of erasure. Each block BLK includes a plurality of NAND strings, for example, 8192 NAND strings. Each of the select transistors STD included in the plurality of NAND strings has its drain connected to a bit line BL and its gate connected to a select gate line SGD in a common connection manner. Each of the select transistors STS included in the plurality of NAND strings has its source connected to a source line SRC in a common connection manner and its gate connected to a select gate line SGS in a common connection manner.

In each of the NAND strings, a plurality of memory cells MC (hereinafter, may be referred to simply as cells), for example, 32 memory cells MC, are so arranged that the current paths of the individual memory cells are connected in series between the source of the select transistor STD and the drain of the select transistor STS. That is, a plurality of memory cells MC is connected in series in the column direction in such a manner that the adjacent memory cells share the diffused region (the source region or drain region).

The control gate electrodes of the memory cells MC are connected to word lines WL0 to WL31 in a one-to-one correspondence, starting with the memory cell closest to the select transistor STD. That is, the drain of the memory cell MC connected to word line WL0 is connected to the source of the select transistor STD and the source of the memory cell MC connected to word line WL31 is connected to the drain of the select transistor STS.

Data is written to or read from an even-numbered bit line BLe and an odd-numbered bit line BLo independently. Of 8192 memory cells connected to a single word line WL, for example, data is written to or read from 4096 memory cells connected to bit line BLe simultaneously. 4096 memory cells, each storing one bit of data, are gathered to form a unit known as a page. A page is the minimum unit of writing and reading. When 2 bits of data are stored in a single memory cell MC, 4096 memory cells store 2 pages of data. Similarly, 4096 memory cells connected to bit line BLo form another two pages. Data is written to or read from the memory cells in a page simultaneously.

Furthermore, the bit line BL connects the drains of the select transistors STD between the blocks in a common connection manner. That is, the NAND strings in the same column in a plurality of blocks are connected to the same bit line BL.

FIG. 5 is a sectional view showing the configuration of a NAND string. In a p-type semiconductor substrate (p-sub), a p-well is formed via an n-well. Each of the memory cells MC is composed of a MOSFET (metal oxide semiconductor field-effect transistor) with a stacked gate structure formed on the p-well. The stacked gate structure is so configured that a tunnel insulating film 23, a charge storage layer (floating gate electrode) 24, an inter-gate insulating film 25, and a control gate electrode 26 are stacked one on top of another in that order on the p-well. In the p-well between adjacent stacked gate structures, a diffused region (source region or drain region) is provided.

The threshold voltage of the memory cell MC changes according to the number of electrons accumulated in the floating gate electrode 24. The memory cells MC store data according to the difference between the threshold voltages. The memory cell MC may be configured to store binary (one bit) or multiple values (data equal to or larger than 2 bits). The memory cell MC may be a floating-gate memory cell whose charge storage layer is a floating gate electrode composed of a conductive material, such as polysilicon, or a MONOS (metal-oxide-nitride-oxide-semiconductor) memory cell whose charge storage layer is an insulating material, such as silicon nitride. In the case of a MONOS memory cell, the inter-gate insulating film 25 is referred to as a block insulating film.

The select transistor STD is composed of a source region 27S and a drain region 27D provided in the p-well so as to be separated from each other, a gate insulating film 28 provided on a channel region between the source region 27S and drain region 27D, and a gate electrode provided on the gate insulating film 28. The select transistor STS has the same configuration.

Figure 6:
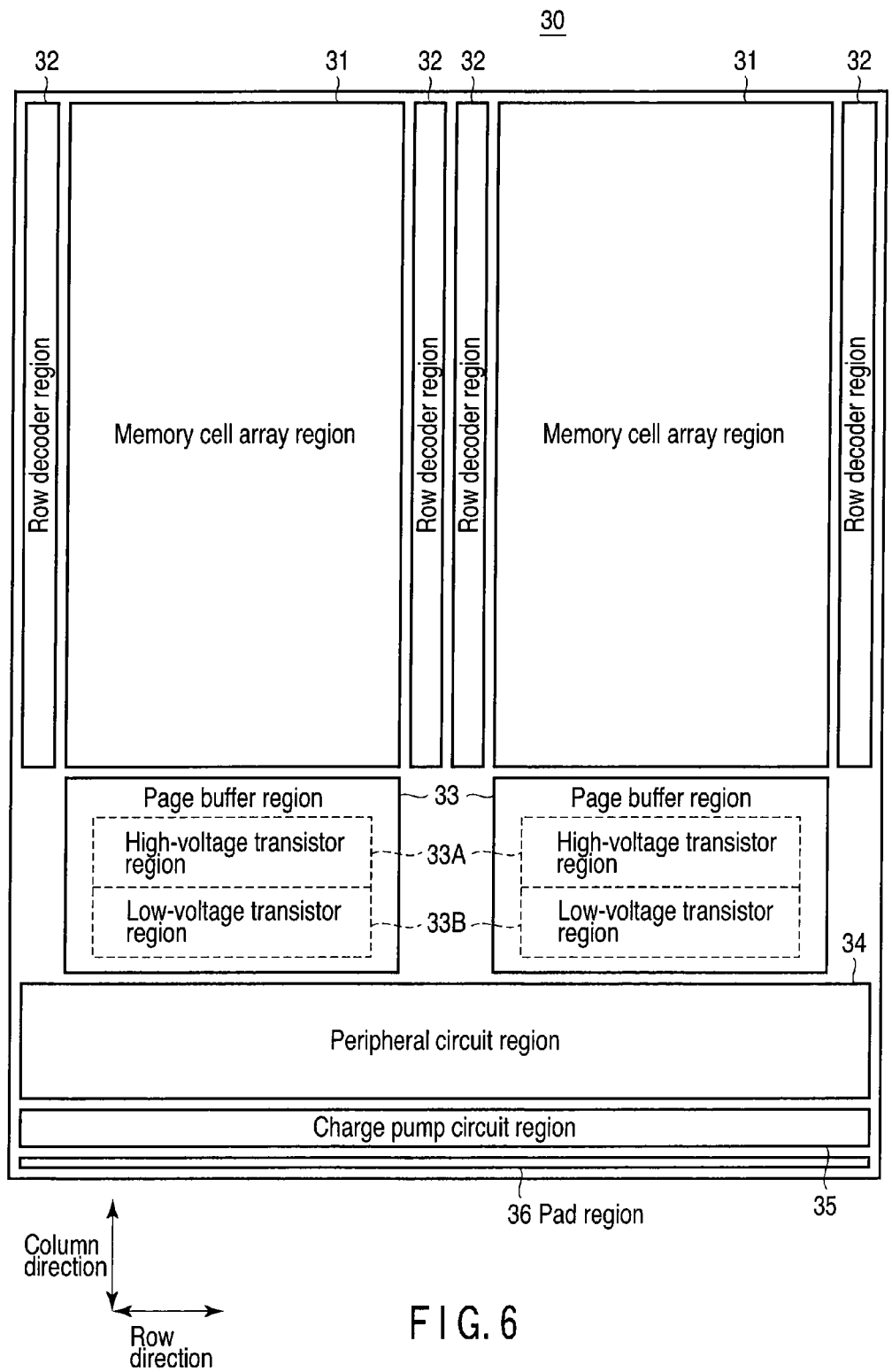
FIG. 6 is a plan view of a chip layout.

FIG. 6 is a plan view of a chip layout. In a semiconductor chip 30, there are provided memory cell array regions 31, row decoder regions 32, page buffer regions 33, a peripheral circuit region 34, a charge pump circuit region 35, and a pad region 36.

In the first embodiment, two memory cell regions 31 are provided. In each of the memory cell regions 31, a memory cell array 1 is laid out. On either side of the memory cell array region 31 in the row direction, row decoder regions 32 are respectively provided. In each row decoder region 32, a row control circuit 3 is provided.

The page buffer regions 33, peripheral circuit region 34, charge pump circuit region 35, and pad region 36 are arranged side by side in the column direction on one side of the memory cell array 31.

In the page buffer region 33, a rewrite/read circuit (e.g., a page buffer) including the column control circuit 2 is provided. The page buffer, which is a kind of data circuit, temporarily stores, for example, a page of write data to be written to the memory cell array 1 or, for example, a page of read data read from the memory cell array 1.

In the peripheral circuit region 34, the data input/output buffer 6, command interface 7, and state machine 8 are provided.

In the charge pump circuit region 35, a charge pump circuit is provided. The charge pump circuit, which is a kind of step-up circuit, generates a voltage necessary for a write or an erase operation, such as a voltage higher than an external power supply voltage, or an in-chip power supply potential Vdd used in the chip.

The pad region 36, which is provided in one place, is arranged along one side of the chip 30. In the pad region 36, a pad is provided. The pad is a connecting terminal which connects the semiconductor chip 30 with the outside. The pad is connected to, for example, the data input/output buffer 6 and command interface 7.

FIG. 7 shows the configuration of a data circuit 40 which controls the voltage of the bit line BL in a write or read operation. The data circuit 40 is included in the column control circuit 2 of FIG. 3. The data circuit 40 includes a bit-line voltage setting circuit 41, a high-voltage transistor 44, and a sense amplifier (SA) circuit 46. FIG. 7 shows a configuration of the data circuit 40 corresponding to one bit line BL. Actually, there are as many units of the data circuit of FIG. 7 as there are bit lines BL.

The high-voltage transistor 44 is composed of, for example, an n-channel MOS transistor. The source of the high-voltage transistor 44 is connected to a bit line BL. A high voltage VreadH (e.g., 8 V) is applied to the gate of the high-voltage transistor 44. The drain of the high-voltage transistor 44 is connected to the bit-line voltage setting circuit 44. The gate insulating film of the high-voltage transistor 44 is made thick, preventing the erase voltage Vera (e.g., 20 V) used in an erase operation from being applied to the bit-line voltage setting circuit 41 and SA circuit 46 via the bit line BL. The thickness of the gate insulating film of the high-voltage transistor 44 is about 40 nm.

The bit-line voltage setting circuit 41 includes a clamp transistor 42 that clamps the voltage of the bit line BL to a specific voltage and a regulator 43 that controls the gate voltage of the clamp transistor 42. The clamp transistor 42 is composed of, for example, an n-channel MOS transistor.

The source of the clamp transistor 42 is connected to the drain of the high-voltage transistor 44. The gate of the clamp transistor 42 is connected to the regulator 43. The drain of the clamp transistor 42 is connected to the SA circuit 46.

The regulator 43 generates a clamp voltage BLC that changes according to an operation mode and applies the clamp voltage BLC to the gate of the clamp transistor 42. Accordingly, the clamp transistor 42 can set the voltage VBL of the bit line BL arbitrarily according to the clamp voltage BLC.

When charging the bit line, a precharge transistor 45 supplies the power supply voltage Vdd to the drain of the clamp transistor 42. The precharge transistor 45 is composed of, for example, an n-channel MOS transistor. A precharge voltage VPRE is applied to the drain of the precharge transistor 45. A precharge signal BLP is supplied to the gate of the precharge transistor 45. The precharge signal BLP is generated by the state machine 8 and is activated (made high) when the bit line is activated. The source of the precharge transistor 45 is connected to the drain of the clamp transistor 42. When the bit line is charged, the precharge voltage VPRE is set to the power supply voltage Vdd.

When data is written or read, the SA circuit 46 transfers data to the bit line BL or stores data read from the memory cell MC. Data is transferred to the SA circuit 46 via the input/output line pair IO, IOn.

The MOS transistors constituting the bit-line voltage setting circuit 41 and SA circuit 46 are low-voltage transistors. The thickness of their gate insulating film is about 8 nm, which is almost the same as the thickness of the tunnel insulating film of the memory cell MC. The low-voltage transistors constituting the bit-line voltage setting circuit 41 and SA circuit 46 are arranged in a low-voltage transistor region 33B of the page buffer region 33 in the chip layout of FIG. 6. The high-voltage transistor 44 is arranged in a high-voltage transistor region 33A of the page buffer region 33.

(Explanation of Operation)

Next, the operation of the nonvolatile semiconductor memory device (or NAND flash memory) configured as described above will be explained.

Figure 8:
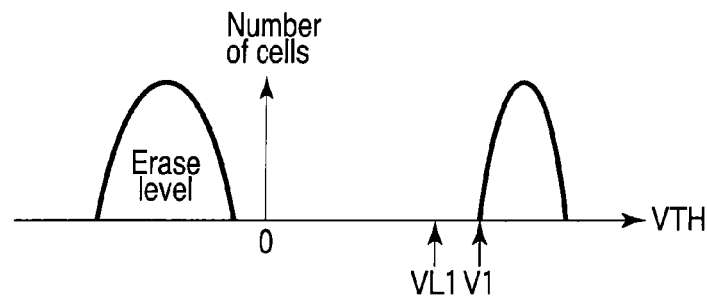
FIG. 8 shows a threshold voltage distribution of a memory cell MC.

FIG. 8 shows a threshold voltage distribution of a memory cell MC. When the data in a memory cell MC is erased, the memory cell MC is set to the threshold voltage at the erase level (in the erased state). For example, the threshold voltage in the erased state is set to the negative side. When data is written to the memory cell MC in the erased state, its threshold voltage shifts to the positive side (the right side of FIG. 8). When the memory cell MC stores one bit, the number of threshold voltage distributions is 2. When the memory cell MC stores two bits, the number of threshold voltage distributions is 4. When the memory cell MC stores three bits, the number of threshold voltage distributions is 8. Similarly, as the number of bits the memory cell MC stores increases, the number of threshold voltage distributions also increases. In the first embodiment, there is no limit on the number of bits the memory cell MC can store. FIG. 8 shows a threshold voltage in the erased state and only one arbitrary threshold voltage distribution in the written state.

In the first embodiment, to narrow the width of a threshold voltage distribution in a write operation of the flash memory, a quick pass write (QPW) method where one write sequence includes two write operations is used.

With the QPW method, in a first write operation, a verify voltage VL1 lower than the proper verify voltage V1 is set and a write and verify operation is carried out. After the first verify operation has been completed, a second write operation is carried out. In the second write operation, the verify voltage is set to the proper verify voltage V1 and a write and verify operation is carried out. In this method, the memory cell MC once written to is written to again, thereby setting a threshold voltage V1 slightly higher than the threshold voltage VL1 written earlier.

In the case of a memory cell MC whose threshold voltage is equal to or lower than the verify voltage VL1, a ground voltage Vss is applied to the bit line BL, thereby writing data to the memory cell MC is at high speed. In contrast, in the case of a memory cell MC whose threshold voltage exceeds the verify voltage VL1 and is equal to or lower than the verify voltage V1, an intermediate potential (e.g., a voltage between Vdd and Vss, such as 1 V) is applied to the bit line BL, thereby making the writing speed is slower. Accordingly, since threshold voltage shift in the second write operation using the verify voltage V1 is small, the width of the threshold voltage can be narrowed.

Figure 9:
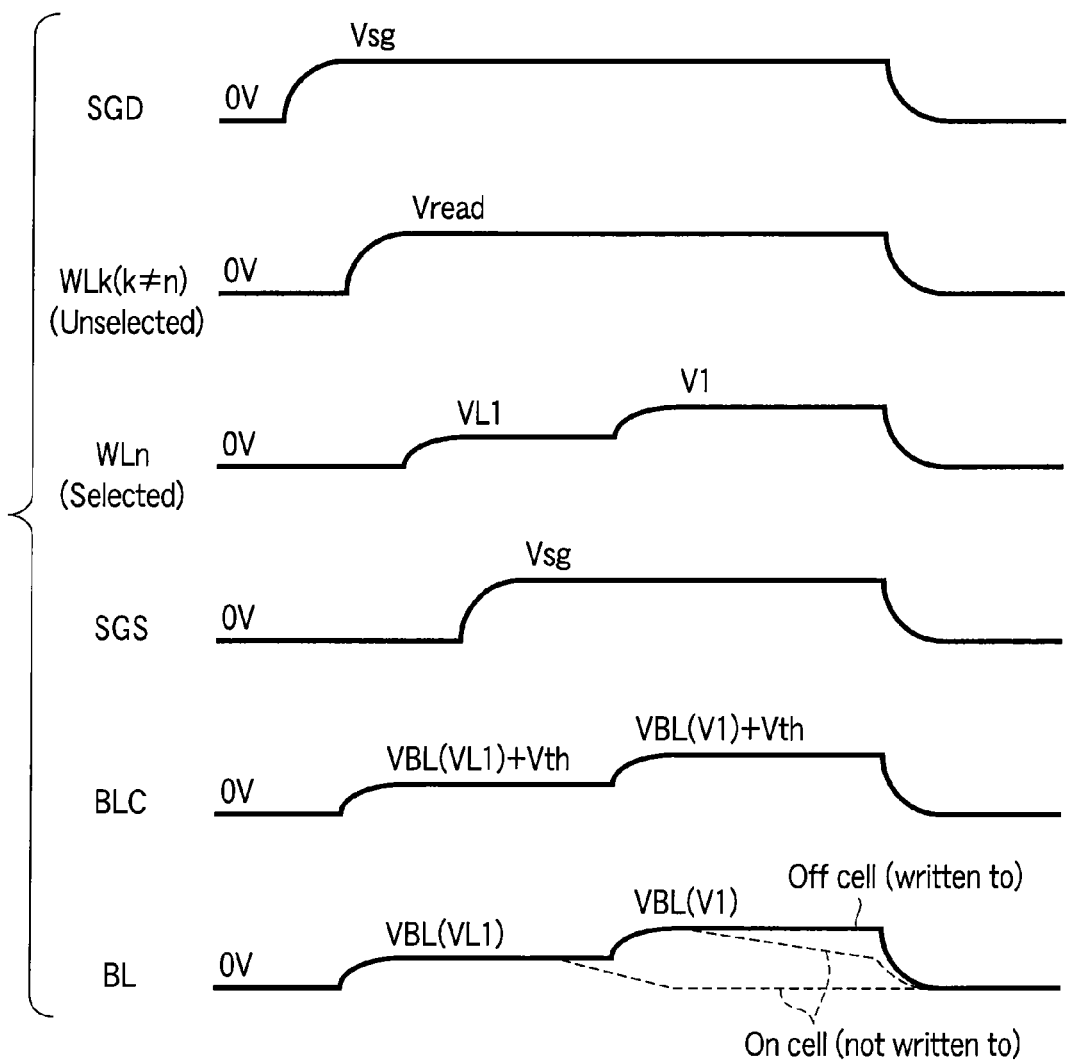
FIG. 9 is a timing chart illustrating a verify operation of the nonvolatile semiconductor memory device according to the first embodiment.

FIG. 9 is a timing chart illustrating a verify operation of the nonvolatile semiconductor memory device. "Verify" is a kind of read operation to check whether the threshold voltage of a memory cell in which data has been written has reached a desired level. More specifically, it is a read operation of applying to the selected word line a verify voltage corresponding to the lower limit of a threshold voltage distribution to be written. As shown in FIGS. 7 and 9, when the word line WLn is selected, a plurality of memory cells MC connected to the selected word line WLn are to be verified and the word lines WLk (k≠n) excluding the selected word line WLn are unselected.

A specific verify voltage Vcgrv is applied to the selected word line WLn. On the basis of the verify voltage Vcrgv, the threshold voltage of a memory cell connected to the selected word line WLn is set. On the other hand, a read voltage Vread higher than all of the threshold voltages is applied to the unselected word lines WLk (k≠n) excluding the selected word line WLn, thereby turning on all the memory cells connected to the unselected word lines WLk.

A write sequence includes a write operation of injecting electrons into the floating gate electrode of a memory cell MC and a verify operation of checking the threshold voltage of the memory cell MC written to. The operation of writing data to the memory cell MC is not particularly limited and any well known technique may be used.

As described above, in the verify operation of the first embodiment, the QPW method has been used. Accordingly, as shown in FIG. 9, in a first verify operation, a verify voltage VL1 lower than the verify voltage V1 is applied to the selected word line WLn. In a second verify operation, the proper verify voltage V1 is applied to the selected word line WLn. In this case, a voltage Vsg (e.g., 4 V) that turns on the select transistors STD and STS is applied to the select gate lines SGD and SGS, thereby turning on the select transistors STD and STS. In the OPW method, the voltages of the word line and select gate line are set by the row control circuit 3 and state machine 8. The same holds true for the explanation below.

In the first embodiment, the charging voltage VBL for the bit line BL in the first verify operation is made different from that in the second verify operation. Specifically, in the first verify operation, the charging voltage for the bit line BL is set to VBL (VL1). In the second verify operation, the charging voltage for the bit line BL is set to VBL(V1) higher than VBL (VL1). Each of VBL (VL1) and VBL (V1) is set higher than the voltage of the source line SRC (i.e., higher than the ground voltage Vss) and equal to or lower than the power supply voltage Vdd.

Such control of the charging voltage VBL for the bit line BL is performed by the bit-line voltage setting circuit 41. Specifically, in the first verify operation, the regulator 43 applies "VBL(VL1)+Vth" as a clamp voltage BLC to the gate of the clamp transistor 42. "Vth" is the threshold voltage of the MOS transistor. At this time, the precharge transistor 45 applies the power supply voltage Vdd (e.g., 3 V) to the drain of the clamp transistor 42. This causes the clamp transistor 42 to charge the bit line BL to VBL(VL1).

Then, in the second verify operation, the regulator 43 applies "VBL(V1)+Vth" as a clamp voltage BLC to the gate of clamp transistor 42. At this time, too, the precharge transistor 45 applies the power supply voltage Vdd to the drain of the clamp transistor 42. This causes the clamp transistor 42 to charge the bit line BL to VBL(V1).

Then, the threshold voltage of the memory cell is determined, depending on the verify voltage VL1 or V1 applied to the selected word line WLn. If the memory cell connected to the selected word line WLn is off, the bit line BL is not discharged, maintaining the charging voltage VBL. If the memory cell is on, the bit line BL is discharged, causing the voltage of the bit line BL toward the ground voltage Vss as the source line SRC. Thereafter, the SA circuit 46 detects the voltage of the bit line after the verify operation, which makes it possible to determine whether the threshold voltage of the memory cell has been set equal to or higher than a desired verify voltage (or whether the verify operation has been passed).

Figure 10:
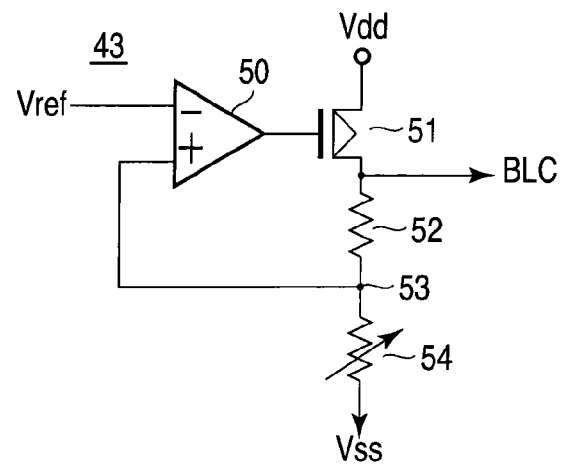
FIG. 10 is a circuit diagram showing the configuration of a regulator 43.

Next, an example of the regulator 43 included in the bit-line voltage setting circuit 41 will be explained. FIG. 10 is a circuit diagram showing the configuration of the regulator 43.

The power supply voltage Vdd is applied to the source of the p-channel MOS transistor 51. The drain of the p-channel MOS transistor 51 is connected to one end of a resistance 52. The other end of the resistance 52 is connected via a connection node 53 to one end of a variable resistor 54. The other end of the variable resistor 54 is connected to the ground.

A reference voltage Vref is applied to the negative input terminal of the differential amplifier 50. The positive input terminal of the differential amplifier 50 is connected to the connection node 53. The output terminal of the differential amplifier 50 is connected to the gate of the p-channel MOS transistor 51. The differential amplifier 50 outputs a voltage obtained by amplifying the difference in voltage between the positive input terminal and the negative input terminal.

Figure 11:
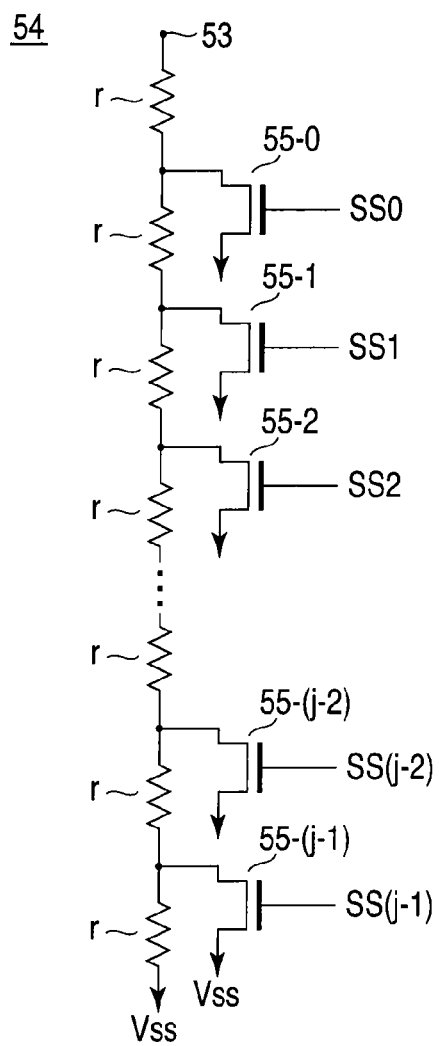
FIG. 11 is a circuit diagram of a variable resistor 54.

FIG. 11 is a circuit diagram of an example of the variable resistor 54 included in the regulator 43. The variable register 54 has a (j+1) number of resistances r, which are connected in series between the connection node 53 and the ground terminal. The drains of n-channel MOS transistors 55-0 to 55-(j−1) are connected to connection nodes between adjacent resistances r in a one-to-one correspondence. Each of the sources of the n-channel MOS transistors 55-0 to 55-(j−1) is connected to the ground. Select signals SS0 to SS(j−1) are supplied to the gates of the n-channel MOS transistors 55-0 to 55-(j−1) in a one-to-one correspondence. These select signals SS0 to SS(j−1) are supplied from the state machine 8. The high level and low level of the select signals SS0 to SS(j−1) are controlled by the state machine 8.

The regulator 43 configured as described above outputs the clamp voltage BLC at the drain of the p-channel MOS transistor 51. Then, the resistance value of the variable resistor 54 is changed by the select signals SS0 to SS(j−1), thereby generating a desired clamp voltage BLC.

As described above, with the first embodiment, a verify operation is performed using the QPW method, thereby making the charging voltage VBL for the bit line in the first verify operation using the verify voltage VBL(VL1) lower than the charging voltage VBL for the bit line in the second verify operation using the verify voltage VBL(V1).

Accordingly, with the first embodiment, the following effects can be obtained. If an arbitrary memory cell which is connected to the selected word line is a first memory cell and a memory cell which is connected to the selected word line and adjoins the first memory cell is a second memory cell, it can be suppressed that the threshold voltage of the first memory cell lowers due to the capacitive coupling between the charge storage layer of the first memory cell and the diffused layer (to which the charging voltage VBL for the bit line is applied) of the second memory cell. This makes it easier for the first verify operation to be passed.

In the second verify operation, the threshold voltage of the first memory cell lowers due to the capacitive coupling between the charge storage layer of the first memory cell and the diffused layer of the second memory cell. This makes it more difficult for the second verify operation to be passed.

Accordingly, since the period of the second verify operation can be virtually lengthened, a variation in the writing speed of each memory cell can be suppressed.

Second Embodiment

When the threshold voltages of a plurality of memory cells connected to the selected word line are set to a desired level, a write loop composed of a write operation and a verify operation is carried out a plurality of times until all the memory cells have been passed. In a second embodiment of the invention, when a plurality of write loops are carried out, the charging voltage for the bit line is changed at intervals of a specific number of write loops.

Figure 12:
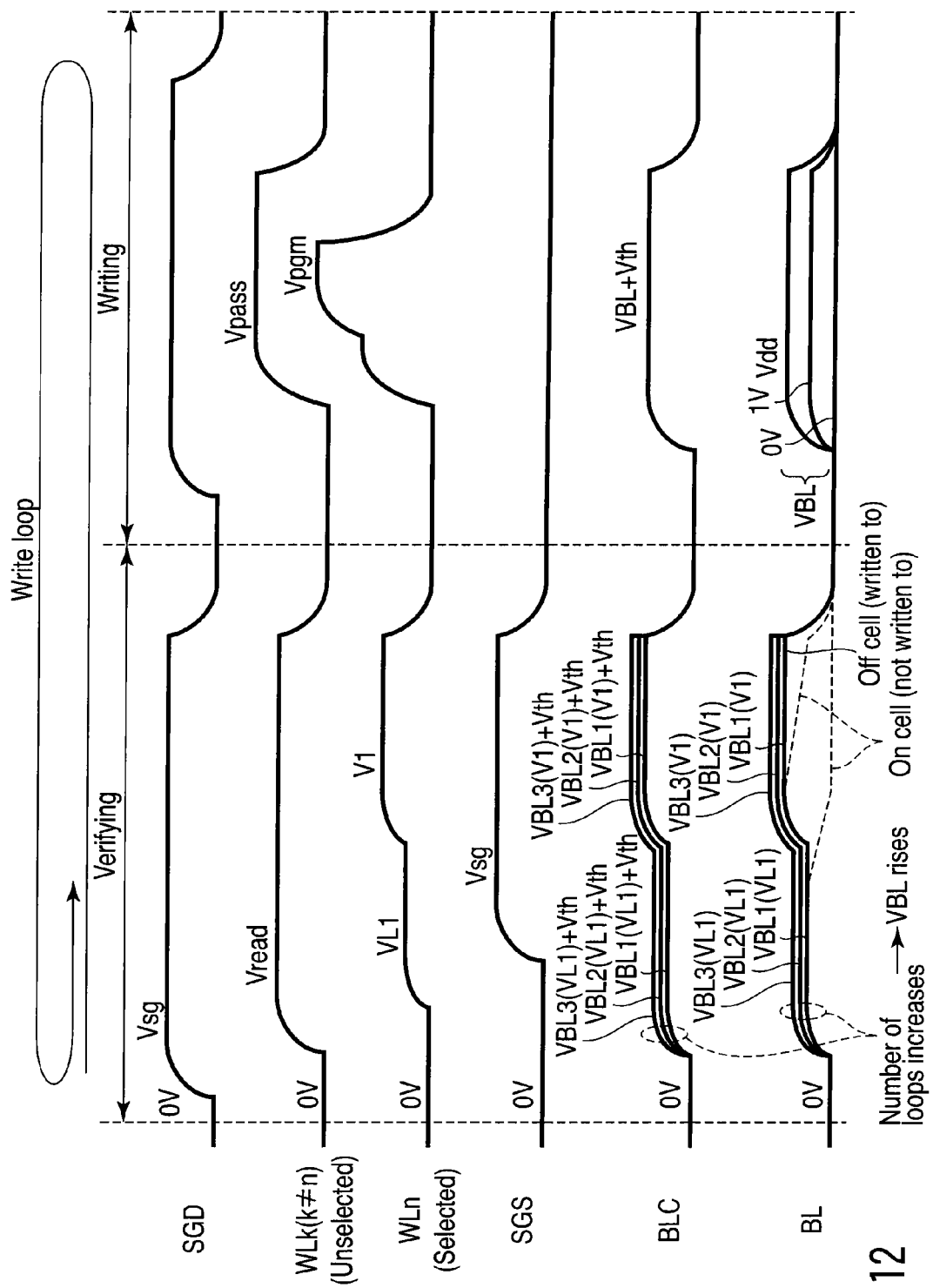
FIG. 12 is a timing chart illustrating a verify operation of a nonvolatile semiconductor memory device according to a second embodiment of the invention.

FIG. 12 is a timing chart illustrating a verify operation of a nonvolatile semiconductor memory device according to the second embodiment. While in the second embodiment, a case where the QPW method is used will be explained as an example as in the first embodiment, the invention may be applied to a case where one verify operation using only the verify voltage V1 is performed without using the QPW method.

The threshold voltage distribution of a memory cell MC is the same as that of FIG. 8 in the first embodiment. An explanation will be given as to a case where data is written to a memory cell using the verify voltages VL1 and V1 until an arbitrary threshold voltage distribution in a written state has been reached.

A first write loop includes one write operation and one verify operation. If the upper limit of the number of write loops is N, a charging voltage VBL1 for the bit line BL is used in a first write loop to a p-th write loop, a charging voltage VBL2 is used in a (p+1)-th to a q-th write loop, and a charging voltage VBL3 is used in a (q+1)-th to an N-th write loop, thereby satisfying the expression VBL1<VBL2<VBL3. Here, p, q, and N fulfill the expression 0<p<q<N.

Since the QPW method is used in the second embodiment, the charging voltage for the bit line BL is set to VBL1(VL1), VBL2(VL1), and VBL3(VL1) according to the number of write loops in a first verify operation using the verify voltage VL1 included in the first write loop. In a second verify operation using the verify voltage V1 higher than the verify voltage VL1 included in the first write loop, the charging voltage for the bit line BL is set to VBL1(V1), VBL2(V1), and VBL3(V1) according to the number of write loops. These charging voltages satisfy the following expressions:

$$VBL1(VL1)<VBL2(VL1)<VBL3(VL1)$$

$$VBL1(V1)<VBL2(V1)<VBL3(V1)$$

Each of VBL1(VL1), VBL2(VL1), and VBL3(VL1) is set higher than the voltage of the source line SRC (i.e., higher than the ground voltage Vss) and equal to or lower than the power supply voltage Vdd. Similarly, each of VBL1(V1), VBL2(V1), and VBL3(V1) is set higher than the ground voltage Vss and equal to or lower than the power supply voltage Vdd.

Such control of the charging voltage VBL for the bit line BL is performed by the bit-line voltage setting circuit 41. Specifically, in the first verify operation (at the verify voltage VL1) included in each of the first to p-th write loops, the regulator 43 applies "VBL1(VL1)+Vth" as the clamp voltage BLC to the gate of the clamp transistor 42. At this time, the precharge transistor 45 applies the power supply voltage Vdd (e.g., 3 V) to the drain of the clamp transistor 42. This causes the clamp transistor 42 to charge the bit line BL to VBL1 (VL1). Then, in the second verify operation (at the verify voltage V1) included in each of the first to p-th write loops, the regulator 43 applies "VBL1(V1)+Vth" as the clamp voltage BLC to the gate of the clamp transistor 42. At this time, too, the precharge transistor 45 applies the power supply voltage Vdd to the drain of the clamp transistor 42. This causes the clamp transistor 42 to charge the bit line BL to VBL1(V1).

In the first verify operation (at the verify voltage VL1) included in each of the (p+1)-th to q-th write loops, the regulator 43 applies "VBL2(VL1)+Vth" as the clamp voltage BLC to the gate of the clamp transistor 42. This causes the clamp transistor 42 to charge the bit line BL to VBL2(VL1). Then, in the second verify operation (at the verify voltage V1) included in each of the (p+1)-th to q-th write loops, the regulator 43 applies "VBL2(V1)+Vth" as the clamp voltage BLC to the gate of the clamp transistor 42. This causes the clamp transistor 42 to charge the bit line BL to VBL2(V1).

In the first verify operation (at the verify voltage VL1) included in each of the (q+1)-th to N-th write loops, the regulator 43 applies "VBL3(VL1)+Vth" as the clamp voltage BLC to the gate of the clamp transistor 42. This causes the clamp transistor 42 to charge the bit line BL to VBL3(VL1). Then, in the second verify operation (at the verify voltage V1) included in each of the (q+1)-th to N-th write loops, the regulator 43 applies "VBL3(V1)+Vth" as the clamp voltage BLC to the gate of the clamp transistor 42. This causes the clamp transistor 42 to charge the bit line BL to VBL3(V1).

Then, the SA circuit 46 detects the voltage of the bit line after each verify operation, thereby determining whether the threshold voltage of the memory cell has been set to a desired verify voltage or higher (or whether the verify operation has been passed).

Next, a write operation included in a write loop will be explained. In a write operation, the voltage Vsg is applied to the select gate line SGD and the ground voltage Vss (0 V) is applied to the select gate line SGS. Consequently, the select transistor STD turns on and the select transistor STS turns off. Here, Vsg is a voltage which enables the select gate transistor on the bit line side to completely transfer a bit-line voltage VBL lower than Vdd for writing. Further, the Vsg is a voltage which enables the select gate transistor on the bit line side to charge the bit line to Vdd-Vt and then cut off for a write-inhibiting bit-line voltage (power supply voltage Vdd). Vt is a threshold voltage of the select gate transistor on the bit line side.

Then, a write voltage Vpgm (e.g., 20 V) is applied to the selected word line WLn and a pass voltage Vpass (e.g., 10 V) is applied to the unselected word lines WLk. The clamp voltage BLC is set to "VBL+Vth" according to the written state of the memory cell. "VBL" is set to 0 V for a memory cell whose threshold voltage is lower than the verify voltage VL1, to about 1 V for a cell whose threshold voltage is equal to or higher than VL1 and lower than V1, and to the power supply voltage Vdd for a memory cell whose threshold voltage is equal to or higher than the verify voltage V1 (or a memory cell which has been written to). With this setting, the charging voltage VBL for the bit line BL is set to any one of 0 V, 1 V, and Vdd according to the threshold voltage of the memory cell.

If the charging voltage VBL for the bit line BL is 0 V, the magnitude of a rise in the threshold voltage of the memory cell is large. If the charging voltage VBL for the bit line BL is about 1 V, the magnitude of a rise in the threshold voltage of the memory cell is smaller than that when the charging voltage VBL is 0 V. If the charging voltage VBL for the bit line BL is the power supply voltage Vdd, a rise in the threshold voltage of the memory cell is suppressed, preventing the memory cell from being written to any more.

As described in detail, with the second embodiment, when a plurality of write loops are carried out, the charging voltage for the bit line is changed at intervals of a specific number of write loops. In addition, as the number of write loops increases, the charging voltage for the bit line is increased.

Accordingly, according to the second embodiment, the following effects can be obtained. As the number of write loops increases, the number of memory cells which have been written to increases. Accordingly, since the number of memory cells carrying current at the time when the SA circuit 46 detects current increases, a bounce of voltage on the source line tends to increase. As a result, the memory cells which have been written to in the second half loops are verified with a higher reference threshold voltage than the memory cells which have been written to in the first half loops.

However, in the second embodiment, as a write loop goes further into the second half, the charging voltage for the bit line increases, with the result that the threshold voltage of the memory cell becomes lower accordingly. This enables the voltage condition in a verify operation in the first half loops to be made equal to that in the second half loops, which makes it possible to cancel a bounce of voltage on the source line. As a result, the threshold voltage of the memory cell verified in the first half write loops can be made almost equal to that in the second half loops, which enables the width of the threshold voltage distribution to be prevented from becoming greater.

Third Embodiment

When N-bit data (N is a natural number not less than 2) is written to a single memory cell, the memory cell is allocated an N number of page addresses. Therefore, when N-bit data is written to a single memory cell, an N number of write and verify operations are carried out, with the result that data corresponding to the least significant first page address up to data corresponding to the most significant N-th page address are written to the memory cell sequentially. The operation of writing data corresponding to the least significant first page address is referred to as a first stage. The operation of writing data corresponding to the most significant N-th page address is referred to as an N-th stage.

In a third embodiment of the invention, the charging voltage for the bit line is changed from stage to stage in a verify operation. As the stage advances, the charging voltage for the bit line is raised. In a read operation, the charging voltage for the bit line is made higher than that of any stage. For example, the number of stages corresponds to the number of bits which the memory cell is capable of storing. The invention is not limited to this and may use a writing method with the number of stages not more than the number of bits.

[Embodiment of 2 Bits/Cell]

Figure 13:
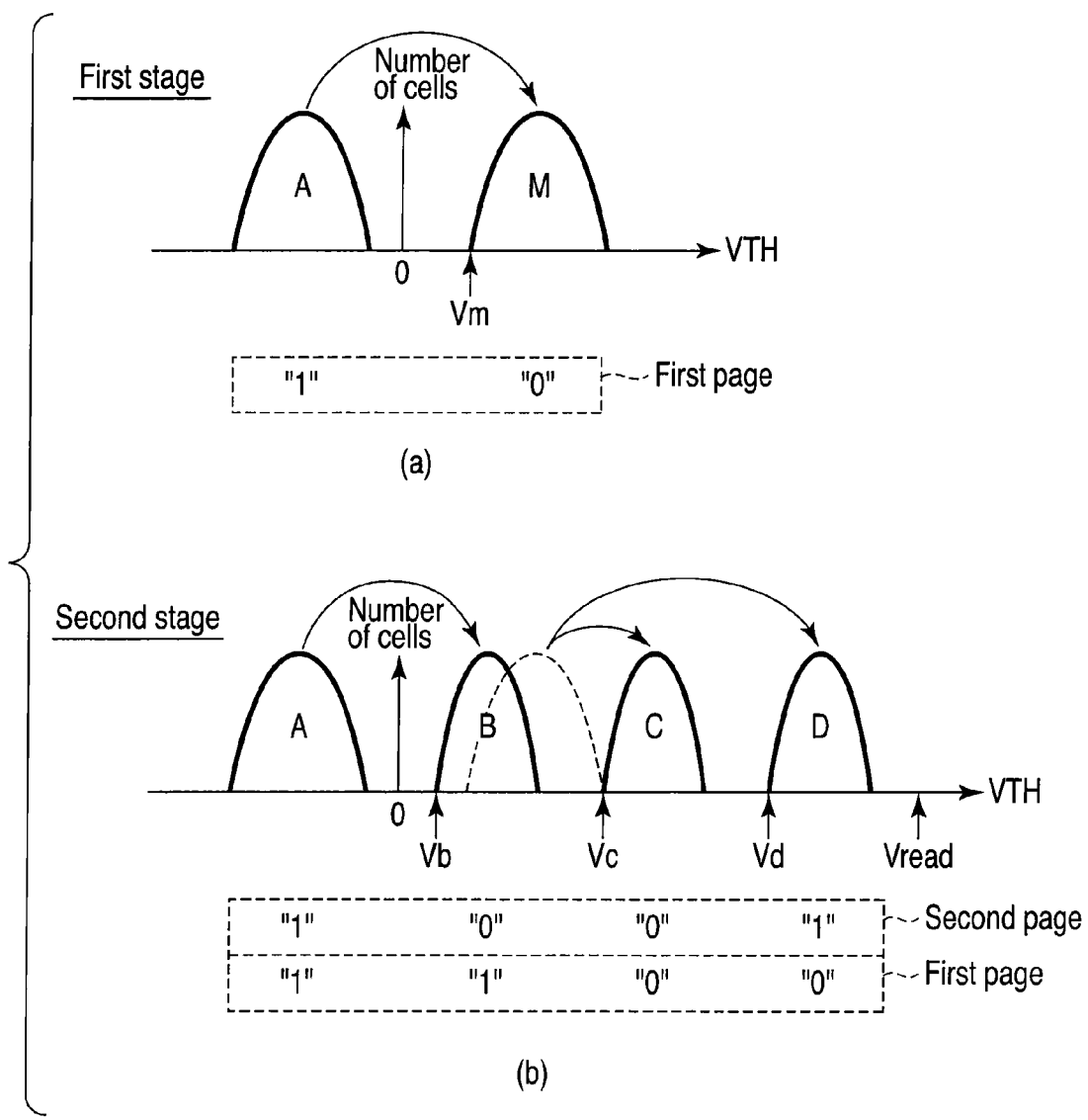
FIG. 13 shows a threshold voltage distribution of a memory cell MC which stores 2-bit data.

An embodiment (2 bits/cell) which stores 2-bit data into a single memory cell will be explained. The writing of 2-bit data is achieved by first-page writing and second-page writing. FIG. 13 shows a threshold voltage distribution of a memory cell MC which stores 2-bit data. When the data in a memory cell MC is erased, the memory cell MC is set to the threshold voltage at level "A" (in the erased state). For example, level "A" in the erased state is set to the negative side.

In the first stage, the first-page writing is performed, which enables the memory cell to store either "1" data with the threshold voltage at level "A" (in the erased state) or "0" data with the threshold voltage at level "M" higher than level "A". In the case of "1" data, the threshold voltage of the memory cell is not shifted. In the case of "0" data, the threshold voltage of the memory cell is shifted to the positive side. The writing of "0" data is performed using a verify voltage Vm.

Then, in the second stage, the second-page writing is performed, which enables the memory cell to store any one of "11" data, "01" data, "00" data, and "10" data. The threshold voltage of "11" data is set to level "A" (in the erased state), the threshold voltage of "01" data is set to level "B", the threshold voltage of "00" data is set to level "C", and the threshold voltage of "10" data is set to level "D". These threshold voltages satisfy the expression A<B<C<D<Vread. In the case of "11" data, the threshold voltage of the memory cell is not shifted. The writing of "01" data is performed using a verify voltage Vb. The writing of "00" data is performed using a verify voltage Vc. The writing of "10" data is performed using a verify voltage Vd. The allocation of threshold voltages and data can be set arbitrarily.

(Explanation of Operation)

Figure 14:
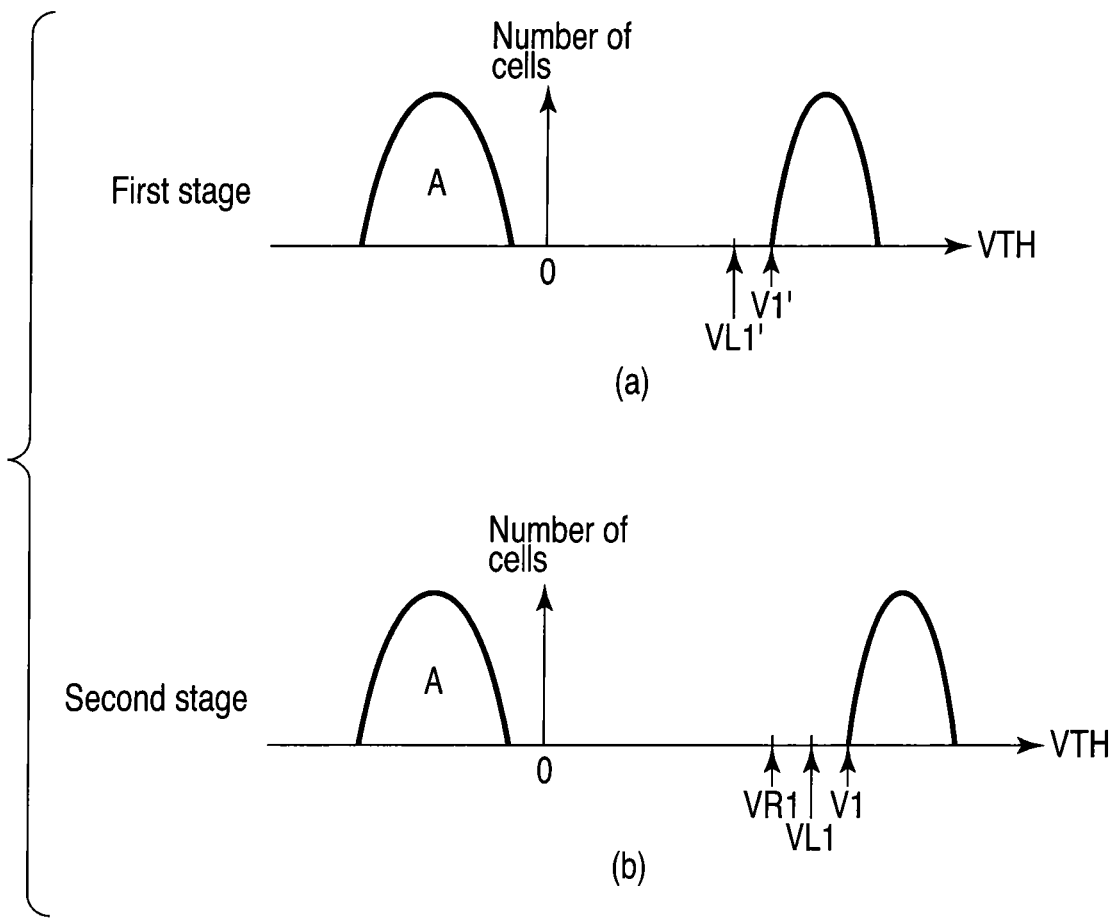
FIG. 14 shows an arbitrary threshold voltage distribution in a written state.

FIG. 14 shows an arbitrary threshold voltage distribution in a written state. In FIG. 14, a threshold voltage distribution at level "A" (in the erased state) and only one arbitrary threshold voltage distribution in the written state are shown. FIG. 14(a) shows a threshold voltage distribution in the first stage and FIG. 14(b) shows a threshold voltage distribution in the second stage. In this embodiment, an explanation will be given using a case where data is written until the threshold voltage in the written state shown in FIG. 14(b) has been reached.

In FIG. 14, verify voltages VL1' and VL1 are used in a first verify operation of the QPW method. Verify voltages V1' and V1 are used in a second verify operation of the QPW method. A read voltage VR1 is used in a read operation of reading the threshold voltage in the written state of FIG. 14(b). As in the first embodiment, in this embodiment, a case where the QPW method is used is explained as an example. However, the invention may be applied to a case where a single verify operation is carried out using only the verify voltage V1 without using the QPW method.

Figure 15:
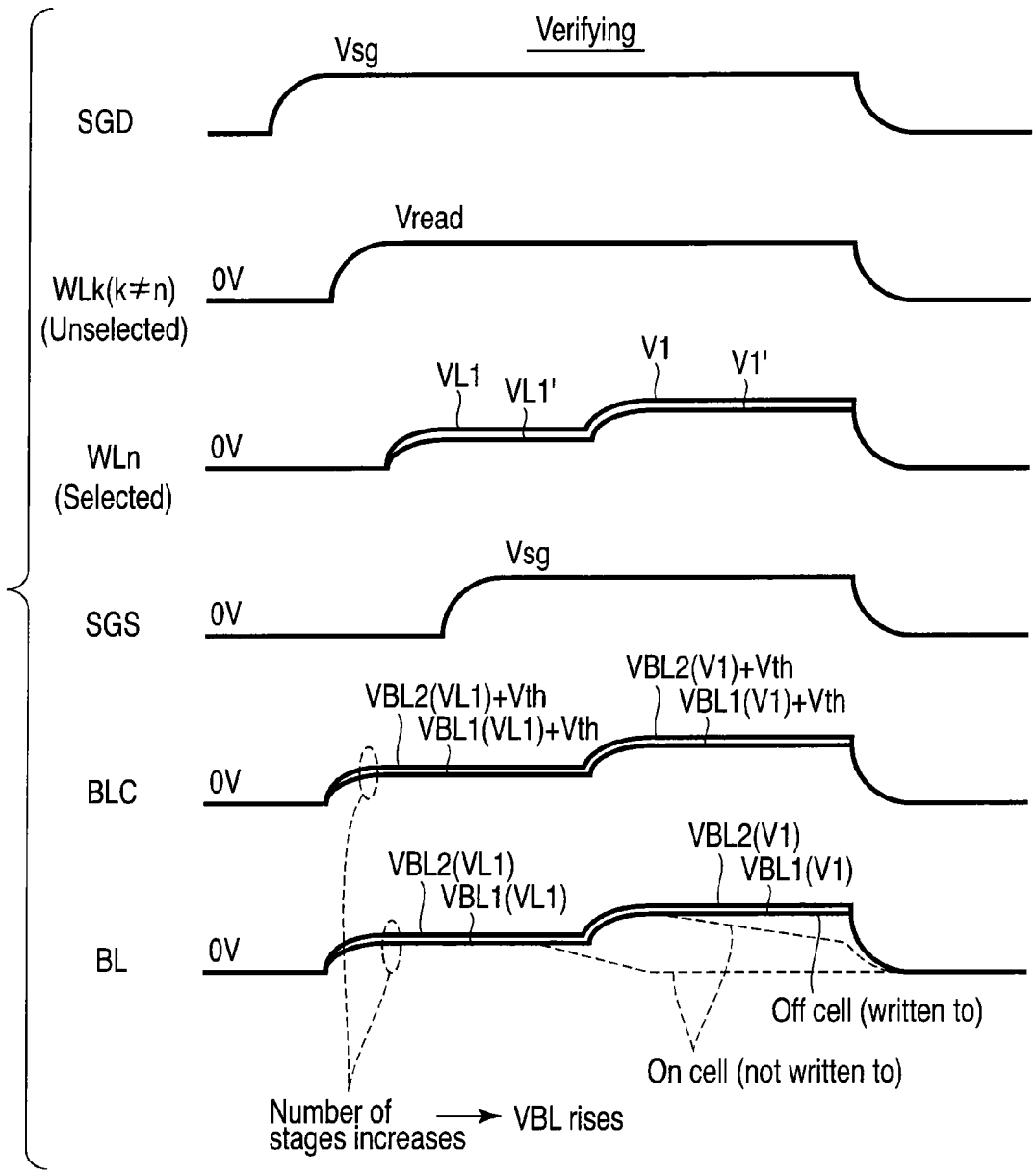
FIG. 15 is a timing chart illustrating a verify operation of a nonvolatile semiconductor memory device according to a third embodiment of the invention.
Figure 16:
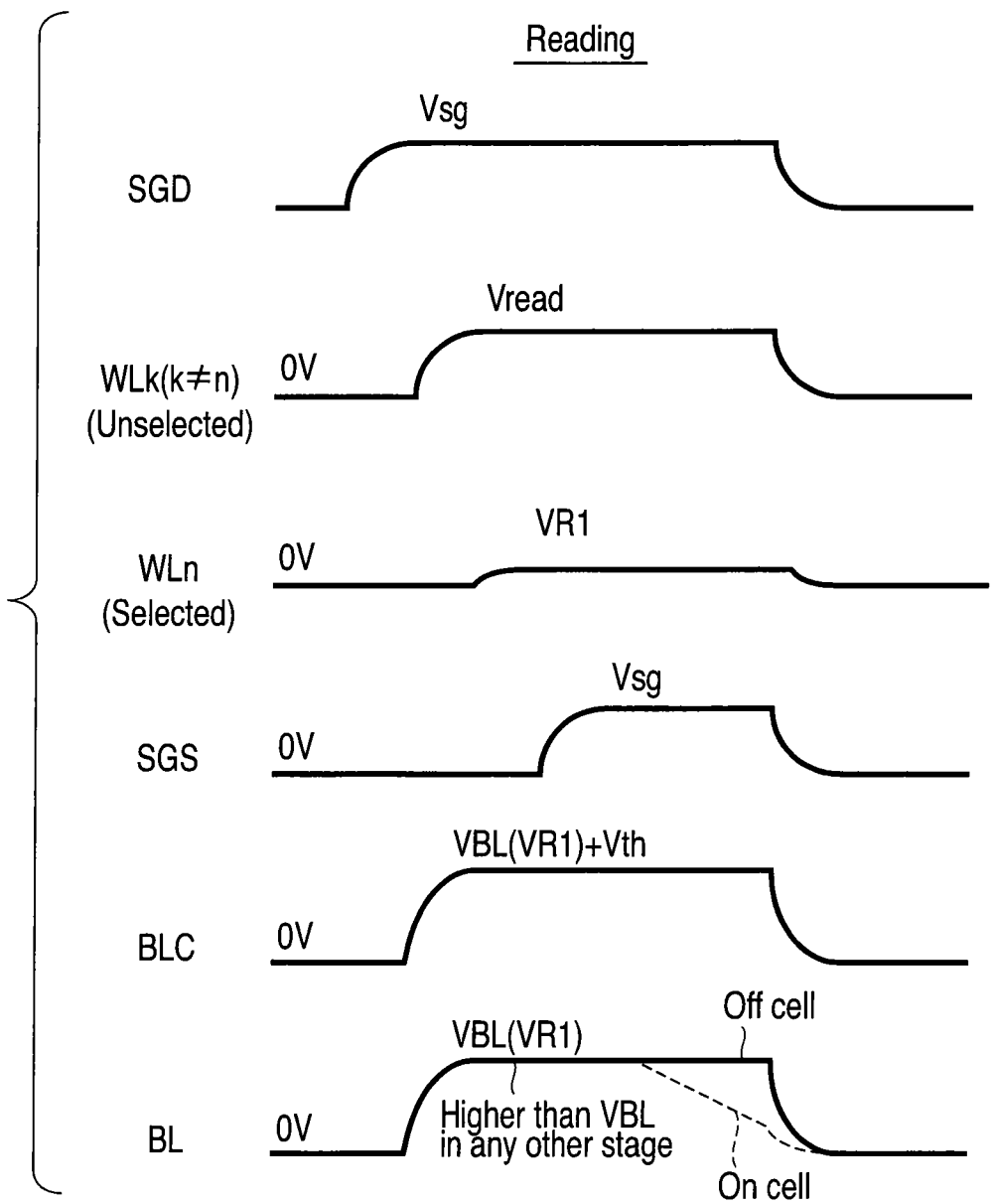
FIG. 16 is a timing chart illustrating a read operation of the nonvolatile semiconductor memory device.

FIG. 15 is a timing chart illustrating a verify operation of a nonvolatile semiconductor memory device according to the third embodiment. FIG. 16 is a timing chart illustrating a read operation of the nonvolatile semiconductor memory device.

As shown in FIG. 15, the charging voltage VBL1 for the bit line BL is used in the first stage corresponding to the first-page verify operation, the charging voltage VBL2 is used in the second stage corresponding to the second-page verify operation, and VBL(VR1) is used in a read operation. VBL1, VBL2, and VBL(VR1) satisfy the expression VBL1≤VBL2<VBL(VR1).

Since the third embodiment uses the QPW method, the charging voltage for the bit line BL is set to VBL1(VL1) and VBL2(VL1) according to the stage in the first verify operation using the verify voltage VL1. In addition, in the second verify operation using the verify voltage V1 higher than the verify voltage VL1, the charging voltage for the bit line BL is set to VBL1(V1) and VBL2(V1) according to the stage. These charging voltages satisfy the following expressions:

$$VBL1(VL1) \leq VBL2(VL1) < VBL(VR1)$$

$$VBL1(V1) \leq VBL2(V1) < VBL(VR1)$$

Each of VBL1(VL1), VBL2(VL1), VBL1(V1), VBL2(V1), and VBL(VR1) is set higher than the voltage of the source line SRC (i.e., higher than the ground voltage Vss) and equal to or lower than the power supply voltage Vdd.

Such control of the charging voltage VBL for the bit line BL is performed by the bit-line voltage setting circuit 41. Specifically, in the first verify operation (at the verify voltage VL1') included in the first stage, the regulator 43 applies "VBL1(VL1)+Vth" as the clamp voltage BLC to the gate of the clamp transistor 42. At this time, the precharge transistor 45 applies the power supply voltage Vdd to the drain of the clamp transistor 42. This causes the clamp transistor 42 to charge the bit line BL to VBL1(VL1). Then, in the second verify operation (at the verify voltage V1') included in the first stage, the regulator 43 applies "VBL1(V1)+Vth" as the clamp voltage BLC to the gate of the clamp transistor 42. At this time, too, the precharge transistor 45 applies the power supply voltage Vdd to the drain of the clamp transistor 42. This causes the clamp transistor 42 to charge the bit line BL to VBL1(V1).

Then, in the first verify operation (at the verify voltage VL1) included in the second stage, the regulator 43 applies "VBL2(VL1)+Vth" as the clamp voltage BLC to the gate of the clamp transistor 42. This causes the clamp transistor 42 to charge the bit line BL to VBL2(VL1). Then, in the second verify operation (at the verify voltage V1) included in the second stage, the regulator 43 applies "VBL2(V1)+Vth" as the clamp voltage BLC to the gate of the clamp transistor 42. This causes the clamp transistor 42 to charge the bit line BL to VBL2(V1).

Then, the voltage of the bit line in each stage is detected by the SA circuit 46, thereby determining whether the threshold voltage of the memory cell has been set to a desired verify voltage or higher (or whether the verify operation has been passed).

Next, a read operation in FIG. 16 will be explained. In a read operation, first, the voltage Vsg is applied to the select gate line SGD, turning on the select transistor STD.

Then, the regulator 43 applies "VBL(VR1)+Vth" higher than VBL in any other stage as the clamp BLC to the gate of the clamp transistor 42. At this time, the precharge transistor 45 has applied the power supply voltage Vdd to the drain of the clamp transistor 42. This causes the clamp transistor 42 to charge the bit line BL to VBL(VR1).

Then, a read voltage Vread higher than all the threshold voltages is applied to the unselected word lines WLk (k≠n) excluding the selected word line WLn, turning on all the memory cells connected to the unselected word lines WLk. Then, the read voltage VR1 is applied to the selected word line WLn. As shown in FIG. 14, the read voltage VR1 is set not only higher than the upper limit of a threshold voltage distribution one level lower than the threshold voltage distribution of the read target but also lower than the verify voltage VL1. Then, the voltage Vsg is applied to the select gate line SGS, turning on the select transistor STS.

At this time, if the memory cell connected to the selected word line WLn is off, the bit line BL is not discharged, maintaining the charging voltage VBL(VR1). On the other hand, if the memory cell is on, the bit line BL is discharged, making the voltage of the bit line BL equal to the voltage of the source line SRC, that is, the ground voltage Vss. Thereafter, the voltage of the bit line after the read operation is detected by the SA circuit 46, thereby enabling the data stored in the memory cell to be read.

[Embodiment of 3 Bits/Cell]

Figure 17:
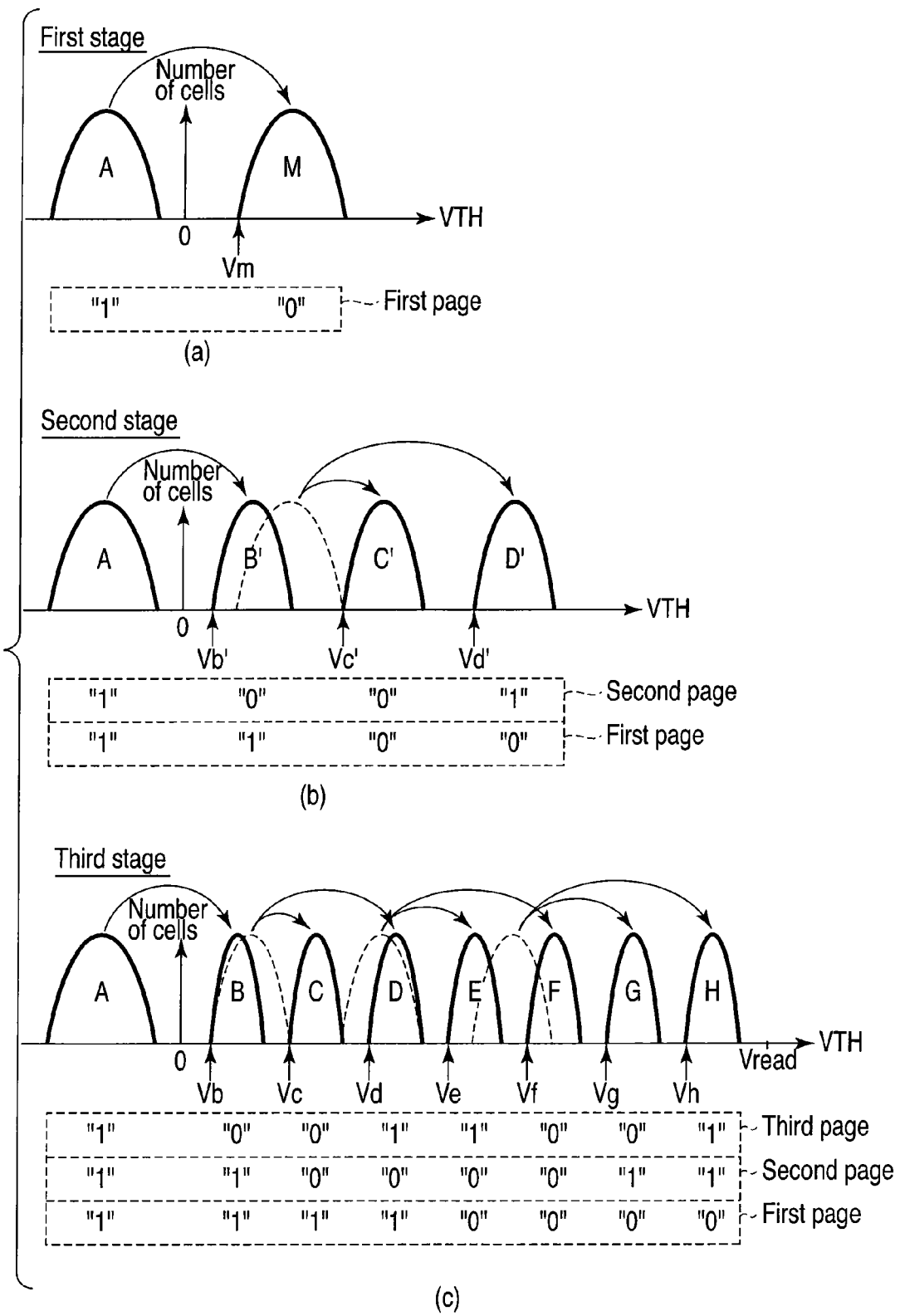
FIG. 17 shows a threshold voltage distribution of a memory cell MC which stores 3-bit data.

An embodiment (3 bits/cell) which stores 3-bit data into a single memory cell will be explained. The writing of 3-bit data is achieved by first-page writing, second-page writing, and third-page writing. FIG. 17 shows a threshold voltage distribution of a memory cell MC which stores 3-bit data.

In the first stage, the first-page writing is performed, which enables the memory cell to store either "1" data with the threshold voltage at level "A" (in the erased state) or "0" data with the threshold voltage at level "M" higher than level "A". In the case of "1" data, the threshold voltage of the memory cell is not shifted. In the case of "0" data, the threshold voltage of the memory cell is shifted to the positive side. The writing of "0" data is performed using a verify voltage Vm.

Then, in the second stage, the second-page writing is performed, which enables the memory cell to store any one of "11" data, "01" data, "00" data, and "10" data. The threshold voltage of "11" data is set to level "A" (in the erased state), the threshold voltage of "01" data is set to level "B'", the threshold voltage of "00" data is set to level "C'", and the threshold voltage of "10" data is set to level "D'". These threshold voltages satisfy the expression A<B'<C'<D'<Vread. In the case of "11" data, the threshold voltage of the memory cell is not shifted. The writing of "01" data is performed using a verify voltage Vb'. The writing of "00" data is performed using a verify voltage Vc'. The writing of "10" data is performed using a verify voltage Vd'.

Then, in the third stage, the third-page writing is performed, which enables the memory cell to store any one of "111" data, "011" data, "001" data, "101" data, "100" data, "000" data, "010" data, and "110" data. The threshold voltage of "111" data is set to level "A" (in the erased state), the threshold voltage of "011" data 1 is set to level "B", the threshold voltage of "001" data is set to level "C", the threshold voltage of "101" data is set to level "D", the threshold voltage of "100" data is set to level "E", the threshold voltage of "000" data 1" is set to level "F", the threshold voltage of "010" data is set to level "G", and the threshold voltage of "110" data is set to level "H". These threshold voltages satisfy the expression A<B<C<D<E<F<G<H<Vread. In the case of "111" data, the threshold voltage of the memory cell is not shifted. The writing of "011" data is performed using a verify voltage Vb. The writing of "001" data is performed using a verify voltage Vc. The writing of "101" data is performed using a verify voltage Vd. The writing of "100" data is performed using a verify voltage Ve. The writing of "000" data is performed using a verify voltage Vf. The writing of "010" data is performed using a verify voltage Vg. The writing of "110" data is performed using a verify voltage Vh. The allocation of threshold voltages and data can be set arbitrarily.

(Explanation of Operation)

Figure 18:
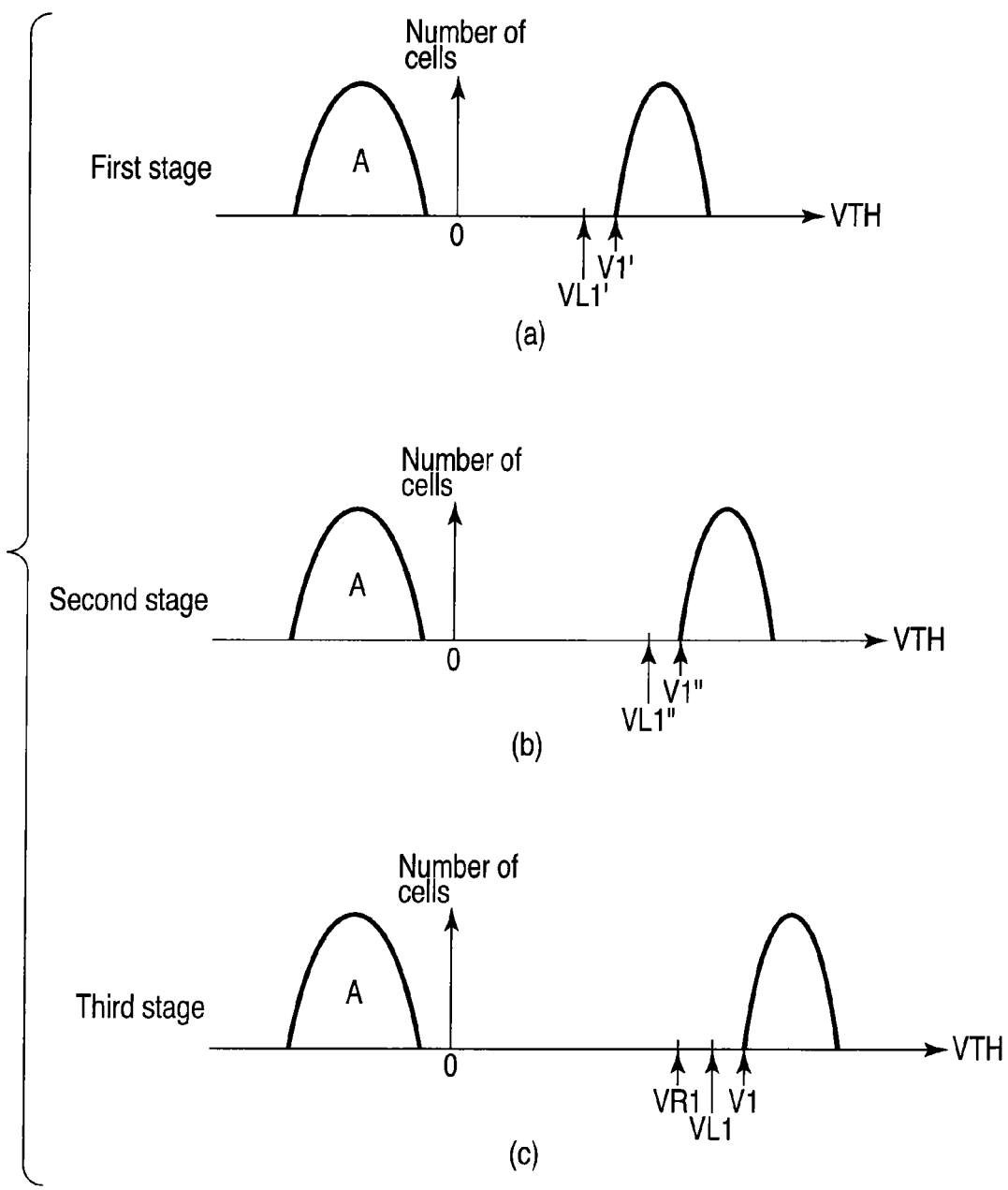
FIG. 18 shows an arbitrary threshold voltage distribution in a written state.

FIG. 18 shows an arbitrary threshold voltage distribution in the written state. In FIG. 18, a threshold voltage distribution at level "A" (in the erased state) and only one arbitrary threshold voltage distribution in the written state are shown. FIG. 18(*a*) shows a threshold voltage distribution in the first stage, FIG. 18(*b*) shows a threshold voltage distribution in the second stage, and FIG. 18(*c*) shows a threshold voltage distribution in the third stage. In this embodiment, an explanation will be given using a case where data is written until the threshold voltage in an arbitrary written state shown in FIG. 18(*c*) has been reached.

In FIG. 18, verify voltages VL1', VL1", and VL1 are used in a first verify operation of the QPW method. Verify voltages V1', V1", and V1 are used in a second verify operation of the QPW method. A read voltage VR1 is used in a read operation of reading the threshold voltage in the written state of FIG. 18(*b*). As in the first embodiment, in this embodiment, a case where the QPW method is used is explained as an example. However, the invention may be applied to a case where a single verify operation is carried out using only the verify voltage V1 without using the QPW method.

Figure 19:
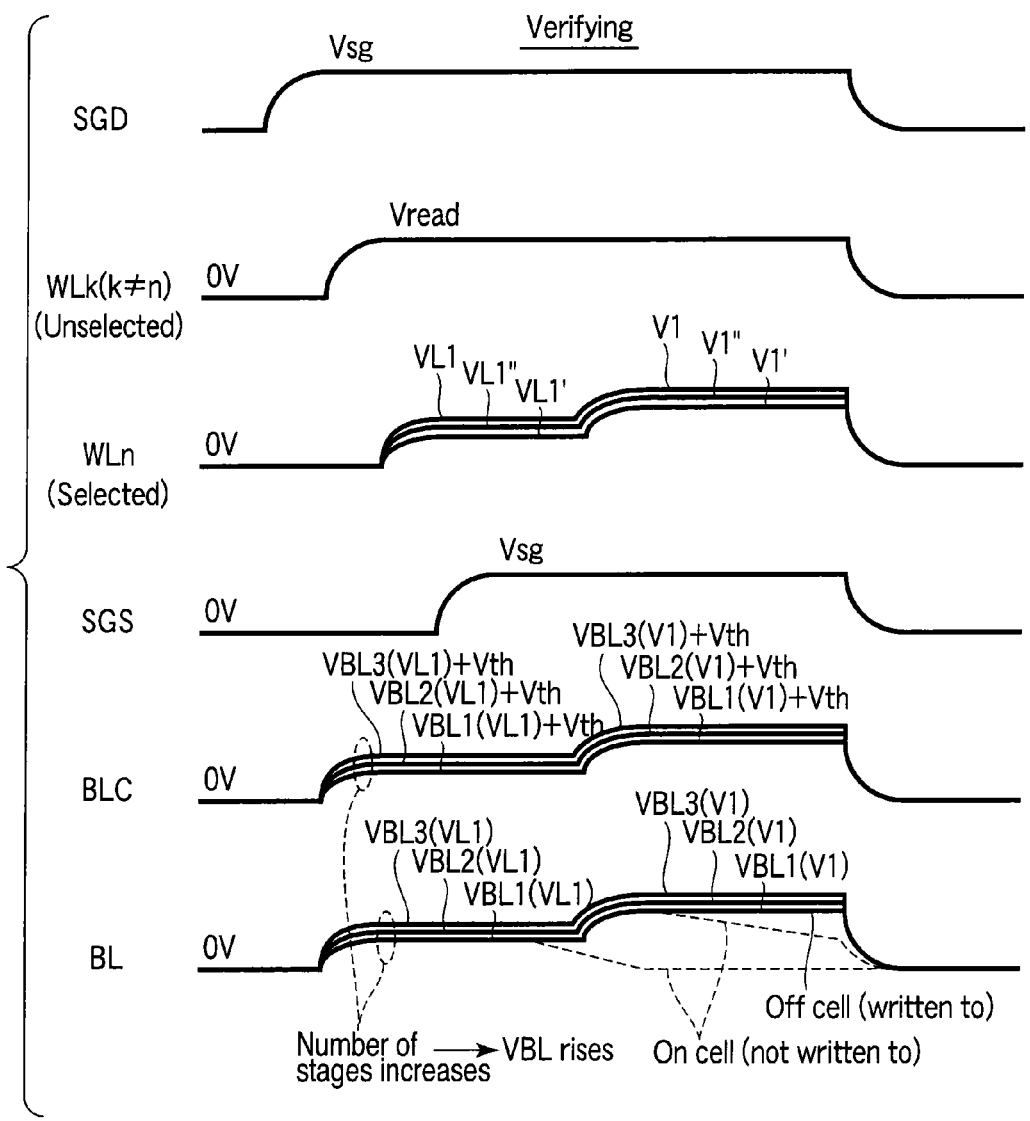
FIG. 19 is a timing chart illustrating another example of the verify operation of the nonvolatile semiconductor memory device according to the third embodiment.

FIG. 19 is a timing chart illustrating a verify operation of a nonvolatile semiconductor memory device with memory cells that store 3-bit data.

As shown in FIG. 19, the charging voltage VBL1 for the bit line BL is used in the first stage corresponding to the first-page verify operation, the charging voltage VBL2 is used in the second stage corresponding to the second-page verify operation, the charging voltage VBL3 is used in the third stage corresponding to the third-page verify operation, and VBL(VR1) is used in a read operation. These charging voltages satisfy the expression VBL1≤VBL2≤VBL3<VBL(VR1).

Since the third embodiment uses the QPW method, the charging voltage for the bit line BL is set to VBL1(VL1), VBL2(VL1), and VBL3(VL1) according to the stage in the first verify operation. In addition, in the second verify operation using the verify voltage V1 higher than the verify voltage VL1, the charging voltage for the bit line BL is set to VBL1(V1), VBL2(V1), VBL3(V1) according to the stage. These charging voltages satisfy the following expressions:

$$VBL1(VL1) \le VBL2(VL1) \le VBL3(VL1) < VBL(VR1)$$

$$VBL1(V1) \le VBL2(V1) \le VBL3(V1) < VBL(VR1)$$

Each of VBL1(VL1), VBL2(VL1), VBL3(VL1), VBL1(V1), VBL2(V1), VBL3(V1), and VBL(VR1) is set higher than the voltage of the source line SRC (i.e., higher than the ground voltage Vss) and equal to or lower than the power supply voltage Vdd.

Such control of the charging voltage VBL for the bit line BL is performed by the bit-line voltage setting circuit 41. Specifically, in the first verify operation (at the verify voltage VL1') included in the first stage, the regulator 43 applies "VBL1(VL1)+Vth" as the clamp voltage BLC to the gate of the clamp transistor 42. At this time, the precharge transistor 45 applies the power supply voltage Vdd to the drain of the clamp transistor 42. This causes the clamp transistor 42 to charge the bit line BL to VBL1(VL1). Then, in the second verify operation (at the verify voltage V1') included in the first stage, the regulator 43 applies "VBL1(V1)+Vth" as the clamp voltage BLC to the gate of the clamp transistor 42. At this time, too, the precharge transistor 45 applies the power supply voltage Vdd to the drain of the clamp transistor 42. This causes the clamp transistor 42 to charge the bit line BL to VBL1(V1).

Then, in the first verify operation (at the verify voltage VL1") included in the second stage, the regulator 43 applies "VBL2(VL1)+Vth" as the clamp voltage BLC to the gate of the clamp transistor 42. This causes the clamp transistor 42 to charge the bit line BL to VBL2(VL1). Then, in the second verify operation (at the verify voltage V1") included in the second stage, the regulator 43 applies "VBL2(V1)+Vth" as the clamp voltage BLC to the gate of the clamp transistor 42. This causes the clamp transistor 42 to charge the bit line BL to VBL2(V1).

Then, in the first verify operation (at the verify voltage VL1) included in the third stage, the regulator 43 applies "VBL3(VL1)+Vth" as the clamp voltage BLC to the gate of the clamp transistor 42. This causes the clamp transistor 42 to charge the bit line BL to VBL3(VL1). Then, in the second verify operation (at the verify voltage V1) included in the third stage, the regulator 43 applies "VBL3(V1)+Vth" as the clamp voltage BLC to the gate of the clamp transistor 42. This causes the clamp transistor 42 to charge the bit line BL to VBL3(V1).

Then, the voltage of the bit line in each stage is detected by the SA circuit 46, thereby determining whether the threshold voltage of the memory cell has been set to a desired verify voltage or higher (or whether the verify operation has been passed).

The read operation is the same as in the embodiment of 2 bits/cell.

[Another Embodiment of 3 Bits/Cell]

FIG. 20 shows a threshold voltage distribution of a memory cell MC which stores 3-bit data. When 3-bit data is written to a memory cell, a write operation is carried out in three stages, that is, a first stage to a third stage, which is the same as in FIG. 17.

In this embodiment, first, one bit of data is stored in a memory cell in the first stage. Then, although the remaining 2 bits of data are stored in the memory cell, 3 bits of data obtained by combining the first stage and the second stage are written in a rough threshold voltage distribution (or written roughly) as shown in FIG. 20(*b*). In this writing method, however, if data reading is requested in the second stage (with the threshold voltage distribution of FIG. 20(*b*)), the data cannot be read exactly. Therefore, the 3-bit data written in the first and second stages is stored in an arbitrary area (hereinafter, referred to as a buffer block) in the memory cell array 1. Specifically, 3-bit data is written to three buffer blocks bit by bit. When data reading is requested in the second stage, the corresponding data is read from the buffer blocks.

Then, in the third stage, the threshold voltage distribution is distributed again exactly. In the method shown in FIG. 20, since the amount of shift in the threshold voltage in the change from the first stage to the second stage is greater than that in the change from the second stage to the third stage, a threshold voltage distribution for 3 bits/cell can be formed after the occurrence of greater intercell interference. Accordingly, the method shown in FIG. 20 can reduce the influence of intercell interference more than in FIG. 17.

In this embodiment, a method of setting the charging voltages VBL1 to VBL3 for the bit line for each stage in a verify operation and a method of setting charging voltage VBL(VR1) for the bit line in a read operation are the same as in FIG. 19.

As described above in detail, with this embodiment, the charging voltage for the bit line is changed for each stage in a verify operation. As the stage advances, the charging voltage for the bit line is raised. Moreover, in a read operation, the charging voltage for the bit line is made higher than that in any other stage.

Accordingly, with this invention, in a verify operation, the lowering of the threshold voltage of a cell due to intercell interference can be avoided in region (II) of FIG. 2.

In addition, as the stage advances, the charging voltage for the bit line is made higher, which makes it possible to make a greater improvement so as to prevent the threshold voltage from lowering in region (II) of FIG. 2 in a verify operation that requires higher-accuracy threshold voltage control. As a result, the controllability in setting a threshold voltage distribution can be improved.

Furthermore, making the charging voltage for the bit line higher in a read operation than in a verify operation enables the threshold voltage distribution of the memory cell to appear lower as the distribution is closer to the erase level. Accordingly, for a part of the cells whose threshold voltage becomes higher due to intercell interference only in a read operation, the threshold voltage of the part of the cells can be caused to appear low. As a result, the number of memory cells over-programmed due to intercell inference can be reduced.

While in the third embodiment, a case where the number of bits a memory cell stores is 2 and 3 has been explained, the invention may be applied to 4-bit or more data.

While in each of the embodiments, the invention has been explained using a case where the invention has been applied to a NAND flash memory, the invention is not limited to a NAND flash memory and may be applied to flash memories excluding AND flash memories, NOR flash memories, NAND flash memories and so on. Furthermore, a semiconductor integrated circuit device which includes a flash memory, such as a processor or a system LSI, is also within the scope of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
    a memory cell string comprising memory cells connected in series;
    a bit line electrically connected to one end of the memory cell string;
    a source line electrically connected to the other end of the memory cell string;
    a control circuit configured to perform a plurality of write operations, each write operation followed by a verify operation for checking a threshold voltage of a memory cell after data is written to the memory cell in the write operation, the verify operation including a first verify process and a second verify process, the control circuit being configured to determine whether a threshold voltage of a memory cell is equal to or higher than a first verify voltage in the first verify process, the control circuit being configured to determine whether the threshold voltage of the memory cell is equal to or higher than a second verify voltage higher than the first verify voltage in the second verify process; and
    a voltage setting circuit connected to the bit line through a transistor and configured to set a charging voltage for the bit line in the verify operation and to make the charging voltage in the second verify process higher than the charging voltage in the first verify process.

2. The device according to claim 1, wherein the memory cell is configured to store n bits (n is a natural number not less than 2), and
    the control circuit is configured to carry out the first and second verify processes each time each bit is written to the memory cell.

3. The device according to claim 1, further comprising word lines connected to gates of the memory cells, wherein the control circuit is configured to apply the first verify voltage and the second verify voltage to a selected word line in the verify operation.

4. The device according to claim 1, further comprising:
    a sense amplifier configured to determine in the verify operation whether the charged bit line has been discharged by the memory cell, thereby detecting the threshold voltage of the memory cell.

5. The device according to claim 1, wherein the voltage setting circuit comprises:
    a clamp transistor which has a source electrically connected to the bit line, a drain electrically connected to a power supply, and a regulator which controls a gate voltage of the clamp transistor.

6. The device according to claim 1, wherein the memory cell comprises:
    a first insulating film, a charge storage layer, a second insulating film, and a gate electrode which are sequentially stacked on a semiconductor substrate.

7. The device according to claim 1, wherein
    the memory cell is configured to store n bits (n is a natural number not less than 2),
    the control circuit is configured to carry out the write operation and the verify operation in each of m stages (m≤n), the number of stages becoming larger as the number of bits stored in the memory cell increases, and
    the voltage setting circuit is configured to make the charging voltage higher in a later stage.

8. The device according to claim 1, wherein
    the control circuit is configured to carry out a write loop including the write operation and the verify operation a plurality of times when setting the memory cell to a specific threshold voltage; and
    the voltage setting circuit is configured to make the charging voltage higher as the number of write loops increases.

9. The device according to claim 8, wherein the memory cell is configured to store n bits (n is a natural number not less than 2), and
    the control circuit is configured to carry out a plurality of write loops each time each bit is written to the memory cell.

10. The device according to claim 1, wherein, in the write operation,
    the voltage setting circuit is configured to apply a first voltage to the bit line connected to the memory cell in which the first verify process has not passed, and
    the voltage setting circuit is configured to apply a second voltage higher than the first voltage to the bit line connected to the memory cell in which the first verify process has passed and the second verify process has not passed.

* * * * *